(12) United States Patent
Eldridge et al.

(10) Patent No.: US 7,671,614 B2
(45) Date of Patent: Mar. 2, 2010

(54) APPARATUS AND METHOD FOR ADJUSTING AN ORIENTATION OF PROBES

(75) Inventors: Benjamin N. Eldridge, Danville, CA (US); Eric D. Hobbs, Livermore, CA (US); Gaetan L. Mathieu, Livermore, CA (US); Makarand S. Shinde, Livermore, CA (US); Alexander H. Slocum, Bow, NH (US)

(73) Assignee: FormFactor, Inc., Livermore, CA (US)

( * ) Notice: Subject to any disclaimer, the term of this patent is extended or adjusted under 35 U.S.C. 154(b) by 100 days.

(21) Appl. No.: 11/164,737

(22) Filed: Dec. 2, 2005

(65) Prior Publication Data
US 2007/0126435 A1    Jun. 7, 2007

(51) Int. Cl.
  *G01R 31/02* (2006.01)
(52) U.S. Cl. .................................................. 324/758
(58) Field of Classification Search .................. None
See application file for complete search history.

(56) References Cited

U.S. PATENT DOCUMENTS

| | | | |
|---|---|---|---|
| 4,677,474 A | | 6/1987 | Sato |
| 5,172,053 A | * | 12/1992 | Itoyama ..................... 324/758 |
| 5,399,983 A | * | 3/1995 | Nagasawa ................... 324/758 |
| 5,525,912 A | * | 6/1996 | Momohara .................. 324/754 |
| 5,798,651 A | | 8/1998 | Aruga |
| 5,804,983 A | * | 9/1998 | Nakajima et al. ........... 324/758 |
| 5,825,192 A | * | 10/1998 | Hagihara .................... 324/757 |
| 5,828,225 A | * | 10/1998 | Obikane et al. ............. 324/758 |
| 5,974,662 A | * | 11/1999 | Eldridge et al. ............. 324/758 |
| 5,982,182 A | * | 11/1999 | Chiu et al. .................. 324/754 |
| 6,137,296 A | * | 10/2000 | Yoon et al. .................. 324/754 |
| 6,246,247 B1 | | 6/2001 | Eldridge et al. |
| 6,246,251 B1 | | 6/2001 | Gallagher |
| 6,509,751 B1 | * | 1/2003 | Mathieu et al. ............. 324/754 |
| 6,586,956 B2 | * | 7/2003 | Aldaz et al. ................. 324/758 |
| 6,615,485 B2 | | 9/2003 | Eldridge et al. |
| 6,624,648 B2 | | 9/2003 | Eldridge et al. |
| 6,762,612 B2 | * | 7/2004 | Yu et al. ..................... 324/757 |
| 6,784,678 B2 | * | 8/2004 | Pietzschmann ............. 324/758 |
| 6,853,205 B1 | * | 2/2005 | Cheng et al. ................ 324/754 |
| 6,972,578 B2 | | 12/2005 | Martens et al. |
| 7,002,363 B2 | | 2/2006 | Mathieu |
| 7,285,968 B2 | * | 10/2007 | Eldridge et al. ............. 324/754 |
| 7,368,930 B2 | * | 5/2008 | Hobbs et al. ................ 324/758 |
| 7,498,825 B2 | * | 3/2009 | Eldridge et al. ............. 324/754 |
| 2001/0015652 A1 | | 8/2001 | Eldridge et al. |

(Continued)

OTHER PUBLICATIONS

U.S. Appl. No. 09/527,931, filed Mar. 17, 2000, Mathieu et al.

(Continued)

*Primary Examiner*—Jermele M Hollington
(74) *Attorney, Agent, or Firm*—Kirton & McConkie PC

(57) ABSTRACT

Probes of a probe card assembly can be adjusted with respect to an element of the probe card assembly, which can be an element of the probe card assembly that facilitates mounting of the probe card assembly to a test apparatus. The probe card assembly can then be mounted in a test apparatus, and an orientation of the probe card assembly can be adjusted with respect to the test apparatus, such as a structural part of the test apparatus or a structural element attached to the test apparatus.

17 Claims, 21 Drawing Sheets

U.S. PATENT DOCUMENTS

| | | | |
|---|---|---|---|
| 2002/0053734 A1 | 5/2002 | Eldridge et al. | |
| 2003/0085721 A1 | 5/2003 | Eldridge et al. | |
| 2004/0266089 A1 | 12/2004 | Mathieu et al. | |
| 2006/0001440 A1 | 1/2006 | Martens et al. | |
| 2006/0261827 A1* | 11/2006 | Cooper et al. | 324/754 |
| 2007/0007977 A1* | 1/2007 | Eldridge et al. | 324/754 |
| 2007/0126440 A1* | 6/2007 | Hobbs et al. | 324/754 |
| 2008/0042668 A1* | 2/2008 | Eldridge et al. | 324/754 |
| 2008/0100312 A1* | 5/2008 | Breinlinger | 324/754 |
| 2009/0134897 A1* | 5/2009 | Cooper et al. | 324/758 |
| 2009/0160432 A1* | 6/2009 | Eldridge et al. | 324/158.1 |

OTHER PUBLICATIONS

U.S. Appl. No. 11/551,545, filed Oct. 20, 2006, Hobbs et al.
Search Report and Written Opinion Of The International Searching Authority, PCT application PCT/US/2006/046277 (Dec. 10, 2008), 8 pages.
Int'l Preliminary Report On Patentability, PCT application PCT/US/2006/046277 (Jan. 22, 2009), 9 pages.

* cited by examiner

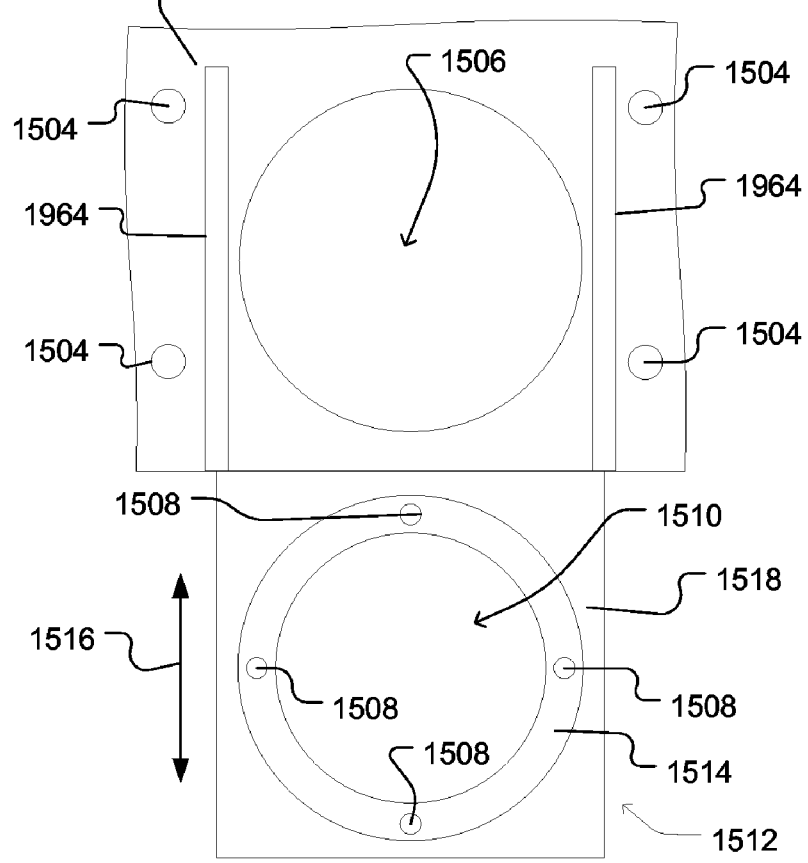
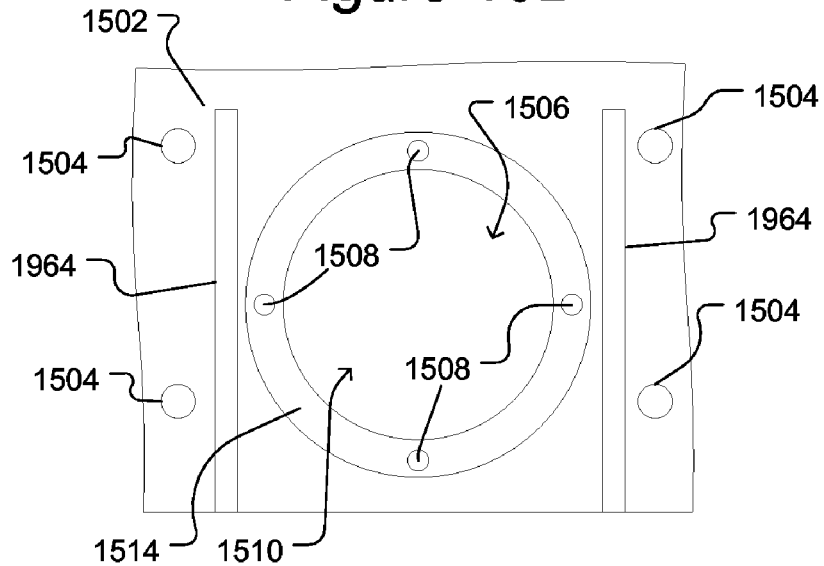

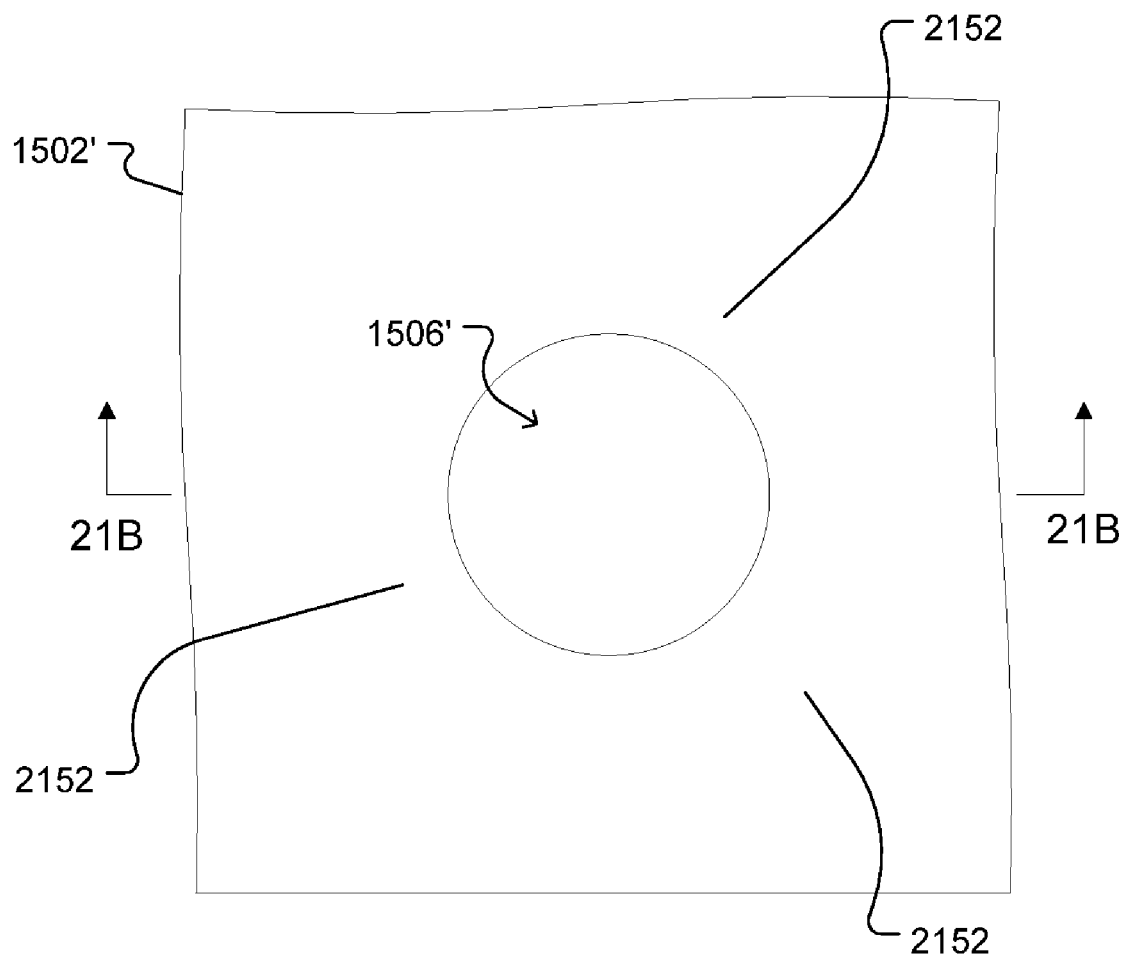

US 7,671,614 B2

APPARATUS AND METHOD FOR ADJUSTING AN ORIENTATION OF PROBES

BACKGROUND

An electronic device, such as a semiconductor die, can be tested by providing test signals to the device and monitoring the response of the device to the test signals. The test signals can be provided to the electronic device through electrically conductive probes that are temporarily pressed against terminals of the electronic device. Response signals generated by the device can similarly be sensed by electrically conductive probes temporarily pressed against terminals of the electronic device. Where multiple probes are pressed against multiple terminals of an electronic device, contact between the probes and the terminals can be facilitated by orienting the probes to correspond to an orientation of the terminals. For example, the terminals can lay in a configuration that defines a surface with a particular shape (e.g., a plane or an approximate plane), in which case contact between the probes and the terminals can be facilitated by orienting the probes to lie in a configuration that defines a surface with a similar shape.

SUMMARY

In an exemplary embodiment of the invention, an orientation of probes of a probe card assembly can be adjusted with respect to an element of the probe card assembly. The probe card assembly can then be mounted in a test apparatus, and an orientation of the probe card assembly can be adjusted with respect to the test apparatus.

DESCRIPTION OF THE DRAWINGS

FIGS. 16A and 16B illustrate an alternative head plate and insert ring that can be used with the test system of FIG. 6 according to some embodiments of the invention.

FIG. 21A shows a top view and FIG. 21B shows a side, cross-sectional view of an alternative version of the head plate and insert ring of FIGS. 16A and 16B and a probe card assembly with a docking and adjustment assembly that can be used with the alternative version of the head plate and insert ring according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein.

Figure 1:
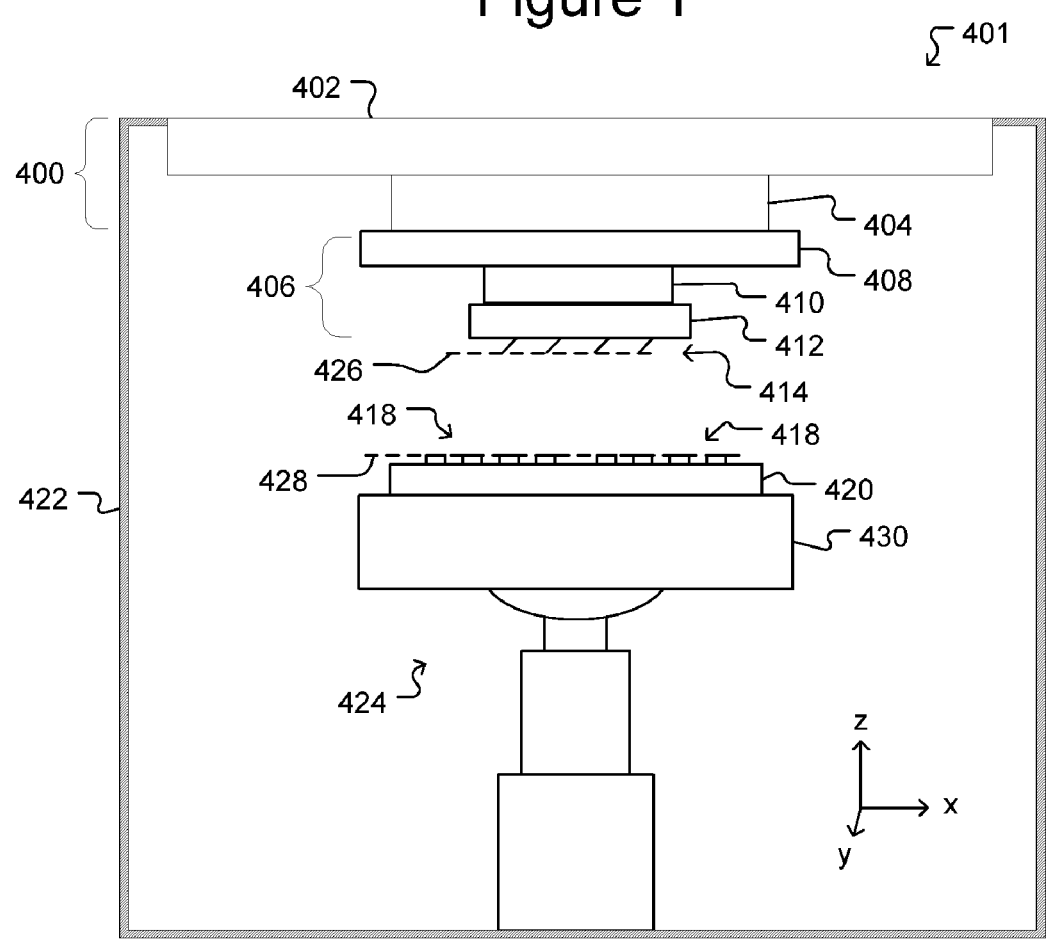
FIG. 1 illustrates an exemplary test system for testing one or more electronic devices according to some embodiments of the invention.

FIG. 1 illustrates a portion of an exemplary test system 401 for testing one or more electronic devices or DUTs 420 according to some embodiments of the invention. (As used herein, "DUT," "electronic device under test," and "electronic device to be tested," refer to one or more electronic devices to be tested or being tested, and non-limiting examples of such electronic devices include one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more printed circuit boards, and any other type of electronic device or devices.) As shown, test system 401 can include a housing 422 that encloses a moveable chuck 424, a docking and adjustment assembly 400, and a probe card assembly 406.

Probe card assembly 406 can include electrically conductive probes 414 configured to contact input and/or output terminals 418 of DUT 420 and thereby make temporary electrical connections with terminals 418. Probes 414 can be a resilient, conductive structure. Non-limiting examples of suitable probes 414 include composite structures formed of a core wire bonded to a conductive terminal (not shown) on a probe substrate 412 that is over coated with a resilient material as described in U.S. Pat. No. 5,476,211, U.S. Pat. No. 5,917,707, and U.S. Pat. No. 6,336,269. Probes 414 can alternatively be lithographically formed structures, such as the spring elements disclosed in U.S. Pat. No. 5,994,152, U.S. Pat. No. 6,033,935, U.S. Pat. No. 6,255,126, U.S. Patent Application Publication No. 2001/0044225, and U.S. Patent Application Publication No. 2001/0012739. Other non-limiting examples of probes 414 include conductive pogo pins, bumps, studs, stamped springs, needles, buckling beams, etc. Indeed, probes 414 can be any structure suitable for making electrical connections with a DUT.

Probe card assembly 406 also can include an electrical interface (not shown) to a tester (not shown), which generates test data to be input into DUT 420 and analyzes response data generated by DUT 420 in response to the test data to determine whether DUT 420 functions properly. Such testers are well known in the field and can comprise a computer or computer system (not shown). Internal electrical paths (not shown) in probe card assembly 406 electrically connect the tester interface (not shown) to probes 414.

Docking and adjustment assembly 400 provides a mechanism for mounting a probe card assembly 406 in housing 422 and for adjusting an orientation of probe card assembly 406. Chuck 424 can include a stage 430 for holding DUT 420 during testing. Chuck 424 can be moveable in the "x," "y," and "z" directions and can also be tilted and rotated. (Directional components are provided in FIG. 1 and throughout the drawings and this specification for convenience and ease of discussion only but not by way of limitation.) In operation, DUT 420 is placed on stage 430, and chuck 424 is moved to align terminals 418 of DUT 420 with probes 414, after which chuck 424 moves terminals 418 into contact with probes 414, which establishes temporary, pressure based electrical connections between probes 414 and DUT terminals 418. As discussed above, while electrical connections are established between probes 414 and terminals 418, test data can be input through probes 414 to DUT 420, and response data generated by DUT 420 can be read from DUT 420 through probes 414. The response data can then be analyzed to determine whether DUT 420 functions properly.

In order to establish electrical connections with terminals 418, contact tips (e.g., the portion of probes 414 configured to contact terminals 418) of probes 414 should be generally co-oriented with terminals 418. (In FIG. 1, a surface (which may correspond generally to a plane or an approximate plane) defined by the contact tips of probes 414 is depicted by dashed line 426, and a surface (which may correspond generally to a plane or an approximate plane) defined by terminals 418 is depicted by dashed line 428.) Although the surface 426 of the contact tips of probes 414 can be out of orientation with the surface 428 of terminals 418 to some degree, if the surface 426 of the contact tips of probes 414 is too far out of orientation with the surface 428 of terminals 418, an electrical connection may not be made between one or more probes 414 and one or more corresponding terminals 418, or even if an electrical connection is made, the electrical connection can have too high a resistance for test and/or response data to pass reliably between probes 414 and terminals 418. In such a case, a fully functional DUT 420 can test as bad.

The exemplary test system 401 shown in FIG. 1 can include two mechanisms for adjusting the orientation (e.g., the shape of a surface defined by the tips of probes 414, such as the planarity or approximate planarity) of contact tips of probes 414. First, probe card assembly 406 can include a planarizing mechanism 410, and second, docking and adjustment assembly 400 can include an adjustment mechanism 404. As will be seen, both planarizing mechanism 410 of probe card assembly 406 and adjustment mechanism 404 of docking and adjustment assembly 400 can adjust an orientation (e.g., the shape of a surface defined by the tips of probes 414, such as the planarity or approximate planarity) of probes 414.

Referring first to probe card assembly 406, as shown in FIG. 1, probe card assembly 406 can include a mounting fixture 408, a planarizing mechanism 410, and a probe substrate 412. The mounting fixture 408 can be configured to attach probe card assembly 406 to docking and adjustment assembly 400. Mounting fixture 408 can comprise a rigid or elastic structure and can perform functions in addition to attaching probe card assembly 406 to docking and adjustment assembly 400. For example, a rigid mounting fixture 408 can also function as a stiffener configured to resist bending, warping, bowing, etc. of the probe card assembly 406. As another example, mounting fixture 408 can comprise a wiring board that can include the interface (not shown) to the tester mentioned above. Alternatively, probe card assembly 406 can include a wiring board (not shown) containing the tester interface (not shown) that is separate and distinct from the mounting fixture 408. In one exemplary embodiment, mounting fixture 408 can comprise a metal plate or a metal truss structure.

As also shown in FIG. 1, probes 414 can be attached to probe substrate 412, which can be any suitable substrate configured to support probes 414 and provide electrical connections to the probes 414. For example, probe substrate 412 can comprise a ceramic, organic, or printed circuit board substrate comprising electrically conductive pads (not shown) on one surface of the substrate and internal conductive paths connecting those pads to terminals (not shown) on another surface of the substrate. Probes 414 can be attached to the pads or the terminals.

Planarizing mechanism 410 is configured to allow selective adjustment of the orientation of probe substrate 412, and thus the contact tips of probes 414, with respect to mounting fixture 408. Planarizing mechanism 410 can also provide other functions, such as attaching probe substrate 412 to mounting fixture 408 and providing electrical paths to and from probe substrate 412.

Figure 2:
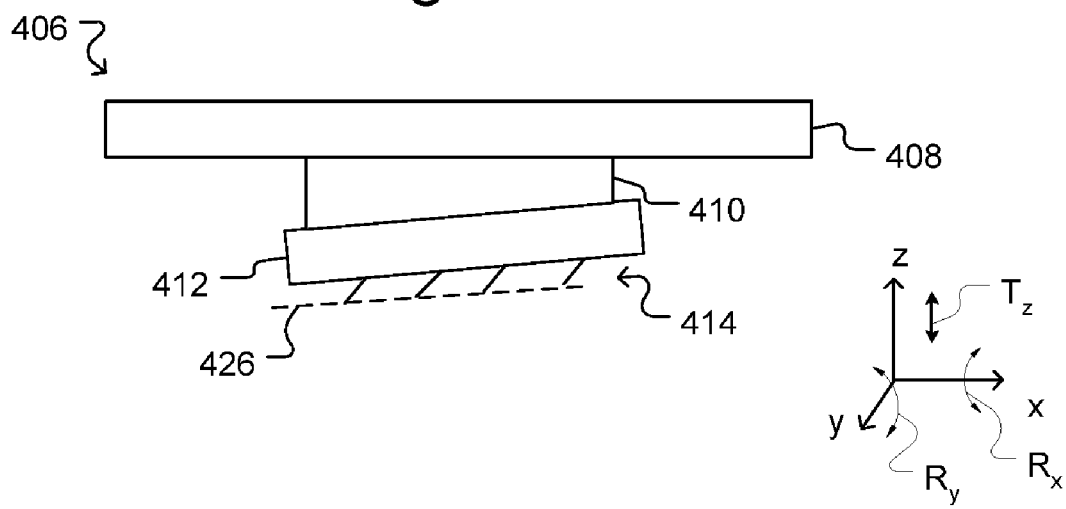
FIGS. 2 and 3 illustrate selective adjustment of the orientation of the probe substrate of a probe card assembly with respect to a mounting fixture of the probe card assembly of FIG. 1.
Figure 3:
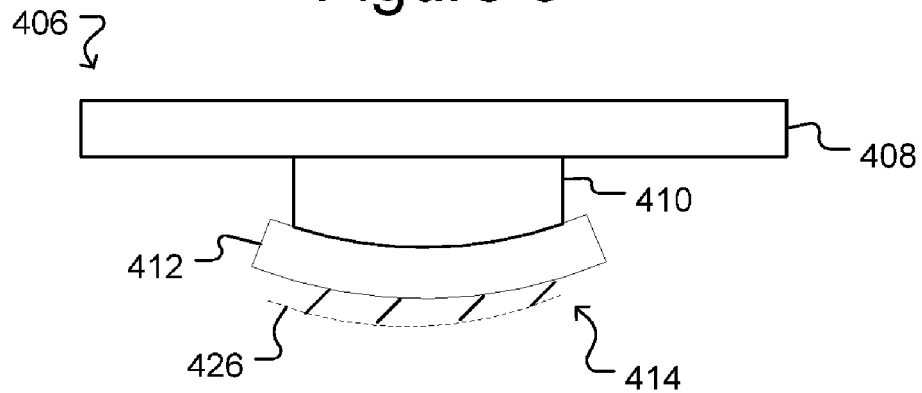
Figure 27:
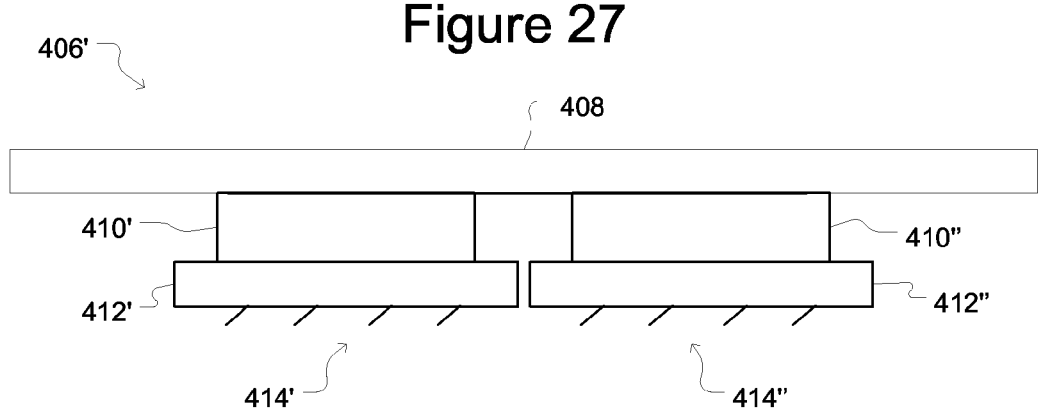
FIG. 27 illustrates an exemplary probe card assembly that include a plurality of probe substrates and planarizing mechanisms.

Probe card assembly 406 is shown in FIGS. 1-3, among other figures, as having one probe substrate 412 with one set of probes 414 for ease of illustrate and discussion. In some embodiments, probe card assembly 406 may be configured with more than one probe substrate 414, each comprising a set of probes 414. The probe substrates 414 can be disposed to form a large array of probes comprising the sets of probes 414 on each of the probe substrates. A simplified, non-limiting example of such a probe card assembly is illustrated in FIG. 27, which is discussed below. Other non-limiting examples of probe card assemblies with a plurality of probe substrates are shown in U.S. patent application Ser. No. 11/165,833, entitled "Method And Apparatus For Adjusting A Multi-Substrate Probe Structure," filed Jun. 24, 2005. Such probe card assemblies may be configured such that each probe substrate is individually moveable independent of the other probe substrate or probe substrates. For example, such a probe card assembly may include multiple planarizing mechanisms 410, which provide for independent movement and adjustment of the orientation of each individual probe substrate 412, such as is shown in FIG. 27. Alternatively, one planarizing mechanism 410 may provide for independent movement and adjustment of the orientation of each individual probe substrate 412. Moreover, if multiple planarizing mechanisms 410 are provided, there can be—but need not be—a one-to-one correspondence between the planarizing mechanisms 410 and the probe substrates 412.

FIGS. 2 and 3 illustrate selective adjustment of the orientation of a probe substrate 412 with respect to mounting fixture 408. As shown in FIG. 2, planarizing mechanism 410 is capable of selectively rotating ($R_x$ and $R_y$) a probe substrate 412 about the "x" and "y" axes and translating ($T_z$) a probe substrate 412 along the "z" axis. (Unless otherwise specified, in all depictions of an "x," "y," and "z" coordinate system throughout the drawings, the "x" axis runs horizontally on a page as depicted, and the "z" axis runs vertically on a page as depicted. The "y" axis, although shown slightly askew so that appears as more than a dot, runs perpendicular to (that is, into and out of) a page. As previously stated, directions stated herein are for clarity and ease of discussion and are not intended to be limiting.)

As shown in FIG. 3, planarizing mechanism 410 can alternatively or additionally be capable of altering a shape of probe substrate 412. For example, planarizing mechanism 410 can be configured to apply alternating and opposing forces to probe substrate 412 to alter the shape of probe substrate, an example of which is shown in FIG. 3. Planarizing mechanism 410 is not limited to imparting a concave shape to probe substrate 412 but can impart many different shapes to probe substrate 412 including, without limitation, a convex shape or complex shapes that have multiple curves and/or changes of direction. Purely linear changes (as shown in FIG. 2)—as opposed to the curved changes shown in FIG. 3—can be made to probe substrate 412, or as another alternative, a combination of linear and curved changes can be made over a portion of a surface or an entire surface of probe substrate 412.

Planarizing mechanism 410 can be any mechanism suitable for altering an orientation of probe substrate 412 with respect to mounting fixture 408. For example, planarizing mechanism 410 can comprise actuators comprising a moveable element, such as a moveable plunger or shaft. As another example planarizing mechanism 410 can comprise differential screw assemblies. Moreover, planarizing mechanism 410 can be manually or machine driven, and planarizing mechanism 410 can be activated at the planarizing mechanism 410 itself or by remote control. In addition, as discussed below with respect to FIGS. 23 and 24, cameras or other sensors can determine positions of probes 414 and provide control signals to planarizing mechanism 410 to adjust automatically the orientation of probes 414.

As discussed above, although not shown in FIGS. 2 and 3, probe card assembly 406 may include multiple probe substrates 412 each having a set of probes 414 and configured on probe card assembly 406 to form a large array of probes comprising the sets of probes 414 disposed on each of the probe substrates 412. As also discussed above, in such a case, planarizing mechanism 410 may be configured to provide for independent movement and adjustment of each of the probe substrates 412. Alternatively, probe card assembly 406 may include multiple planarizing mechanisms 410 configured to provide for independent movement and adjustment of each of the probe substrates 412. Other configurations are also possible.

Figure 9:
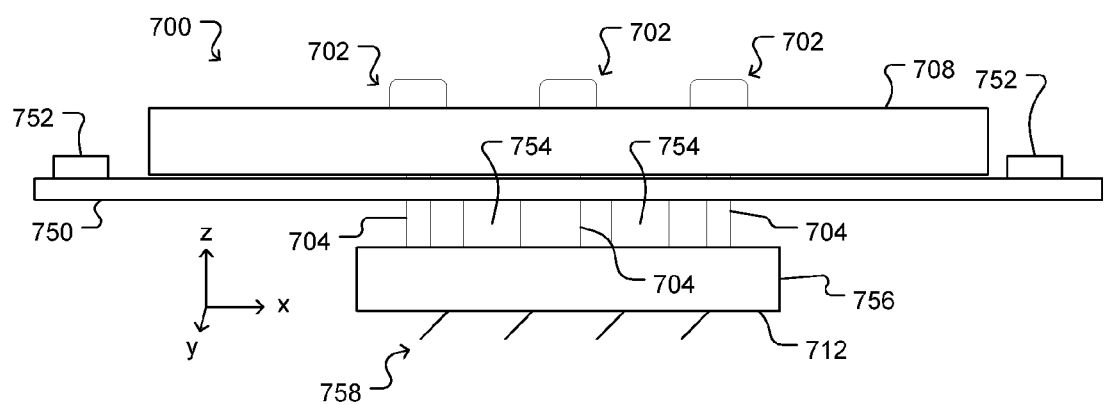
FIG. 9 illustrates an exemplary probe card assembly according to some embodiments of the invention.

As will be seen, non-limiting, exemplary embodiments of probe card assembly 406 are shown in FIGS. 9 and 27. As will be discussed, actuators 702 of FIG. 9 are exemplary embodiments of planarizing mechanism 410, and stiffener 708 is an exemplary embodiment of mounting fixture 408. As also discussed below, other non-limiting, exemplary embodiments of probe card assembly 406 are disclosed in U.S. Pat. No. 5,974,662, entitled "Method Of Planairizing Tips Of Probe Elements Of A Probe Card Assembly"; U.S. Pat. No. 6,509,751, entitled "Planarizer For A Semiconductor Contactor; and the aforementioned U.S. patent application Ser. No. 11/165,833.

Planarizing mechanism 410 thus can change an orientation of probe substrate 412 with respect to mounting fixture 408. Because probes 414 are attached to probe substrate 412, planarizing mechanism 410 thus can adjust a surface 426 defined by contact tips of probes 414 and set the planarity of the contact tips of probes 414 in a desired orientation with respect to mounting fixture 408.

The probe card assembly 406 thus can select a particular orientation of probes 414 with respect to mounting fixture 408 (before or after the probe card assembly 408 is placed in housing 422). For example, the selected orientation of probes 414 can be such that the tips of probes 414 define a surface with a particular shape (e.g., a plane or an approximate plane). After the probe card assembly 406 is attached to the docking and adjustment assembly 400, however, the orientation of probes 414 set by planarizing mechanism 410 may not correspond exactly to an orientation of terminals 418 of DUT 420. For example, as mounted to docking and adjustment assembly 400, probe card assembly 406 can be tilted or askew due to, for example, non-planarities or structural imperfections in the docking and adjustment mechanism 400, chuck 424, and/or other elements of test system 401.

Referring now to docking and adjustment mechanism 400, as shown in FIG. 1, docking and adjustment mechanism 400 can include a reference structure 402 and an adjustment mechanism 404 according to some embodiments of the invention.

Reference structure 402 can comprise any structure already existing in housing 422 or attached to housing 422 that is capable of functioning as a reference to which an orientation of probe card assembly 406 can be adjusted by adjustment mechanism 404, which as will be seen, can comprise manually or machine driven actuators. Reference structure 402 can be rigid or flexible and can have an even or an uneven reference surface (not shown).

Adjustment mechanism 404 can be any mechanism suitable for altering an orientation of probe card assembly 406 while probe card assembly 406 is mounted in housing 422 or, alternatively, before the probe card assembly 406 is mounted in housing 422. For example, adjustment mechanism 404 can comprise actuators comprising a moveable element, such as a moveable plunger or shaft. As another example adjustment mechanism 404 can comprise differential screw assemblies. Moreover, adjustment mechanism 404 can be manually or machine driven, and adjustment mechanism 404 can be activated at the adjustment mechanism itself or by remote control. As will be seen, several non-limiting exemplary, including actuators 702 of FIG. 9, are disclosed herein, and such actuators may comprise differential screw assemblies or other structures having a moveable element, plunger, or element. Another exemplary embodiment of adjustment mechanism 404 can include a plurality of wiffle tree structures (not shown).

Adjustment mechanism 404 can thus change an orientation of probe card assembly 406 with respect to reference structure 402 after probe card assembly 406 has been mounted in and attached to housing 422, although in some configurations, adjustment mechanism 404 can change an orientation of probe card assembly 406 before probe card assembly 406 is mounted in and attached to housing 422. Adjustment mechanism 404 is thus able to adjust further a surface 426 defined by the contact tips of probes 414 and set the orientation of the contact tips of probes 414 in a desired orientation with respect to reference structure 402. The adjustment mechanism 404 can adjust the orientation of the contact tips of probes 414 that were previously planarized by planarizing mechanism 410 to compensate for non-planarities or structural irregularities arising from the mounting (including structures involved in the mounting) of probe card assembly 406 in housing 422.

Either or both of reference structure 402 and adjustment mechanism 404 can be configured to perform additional functions. For example, either or both of reference structure 402 and adjustment mechanism 404 can attach mounting fixture 408 of probe card assembly 406 to housing 422. Alternatively, other structures or fixtures (not shown) can attach mounting fixture 408 of probe card assembly to housing 422.

Figure 4:
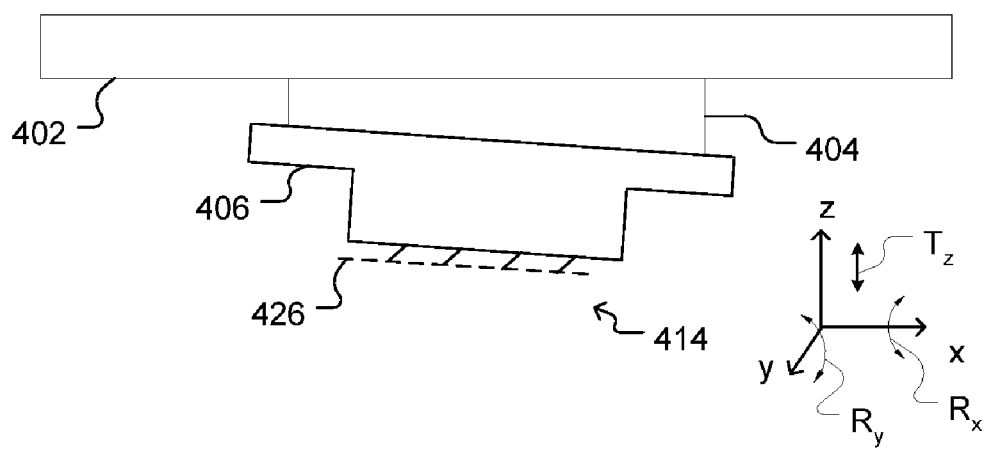
FIGS. 4 and 5 illustrate selective adjustment of the orientation of the probe card assembly with respect to reference structure in the test system of FIG. 1.
Figure 5:
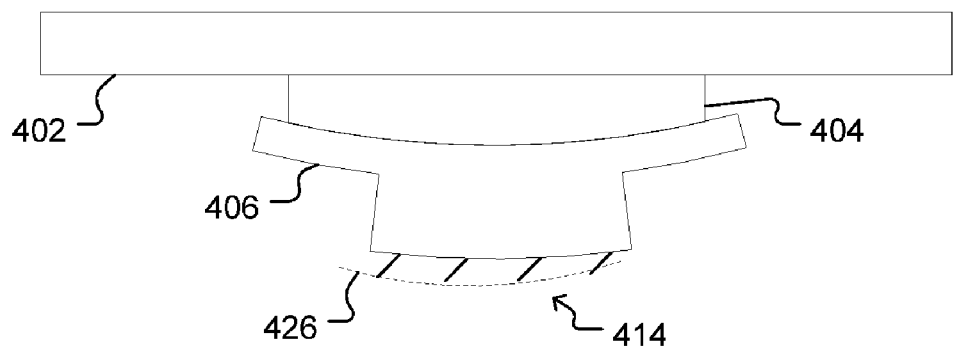

FIGS. 4 and 5 illustrate selective adjustment of the orientation of probe card assembly 406 with respect to reference structure 402. As shown in FIG. 4, adjustment mechanism 404 can selectively rotate ($R_x$ and $R_y$) probe card assembly 406 about the "x" and "y" axes and translate ($T_z$) probe card assembly 406 along the "z" axis.

As shown in FIG. 5, adjustment mechanism 404 can alternatively or additionally alter a shape of probe card assembly 406. For example, adjustment mechanism 404 can be configured to apply alternating and opposing forces to probe card assembly 406 (or to a particular element or elements of probe card assembly 406) that alter the shape of probe card assembly 406, an example of which is shown in FIG. 5. Adjustment mechanism 404 is not limited to imparting a concave shape to probe card assembly 406 but can impart many different shapes to probe card assembly 406 including, without limitation, a convex shape or complex shapes that have multiple curves and/or changes of direction. Purely linear changes (as shown in FIG. 4)—as opposed to the curved changes shown in FIG. 5—can be made to probe card assembly 406, or as another alternative, a combination of linear and curved changes can be made.

FIGS. 6-21B illustrate specific exemplary (though non-limiting) embodiments of docking and adjustment assembly 400 and probe card assembly 406, which are shown and described with reference to a test system 101 for testing DUT 120, which may be any type of DUT described above. As will be seen, test system 101 can include a prober 122, which is a non-limiting example of a housing 422.

Figure 6:
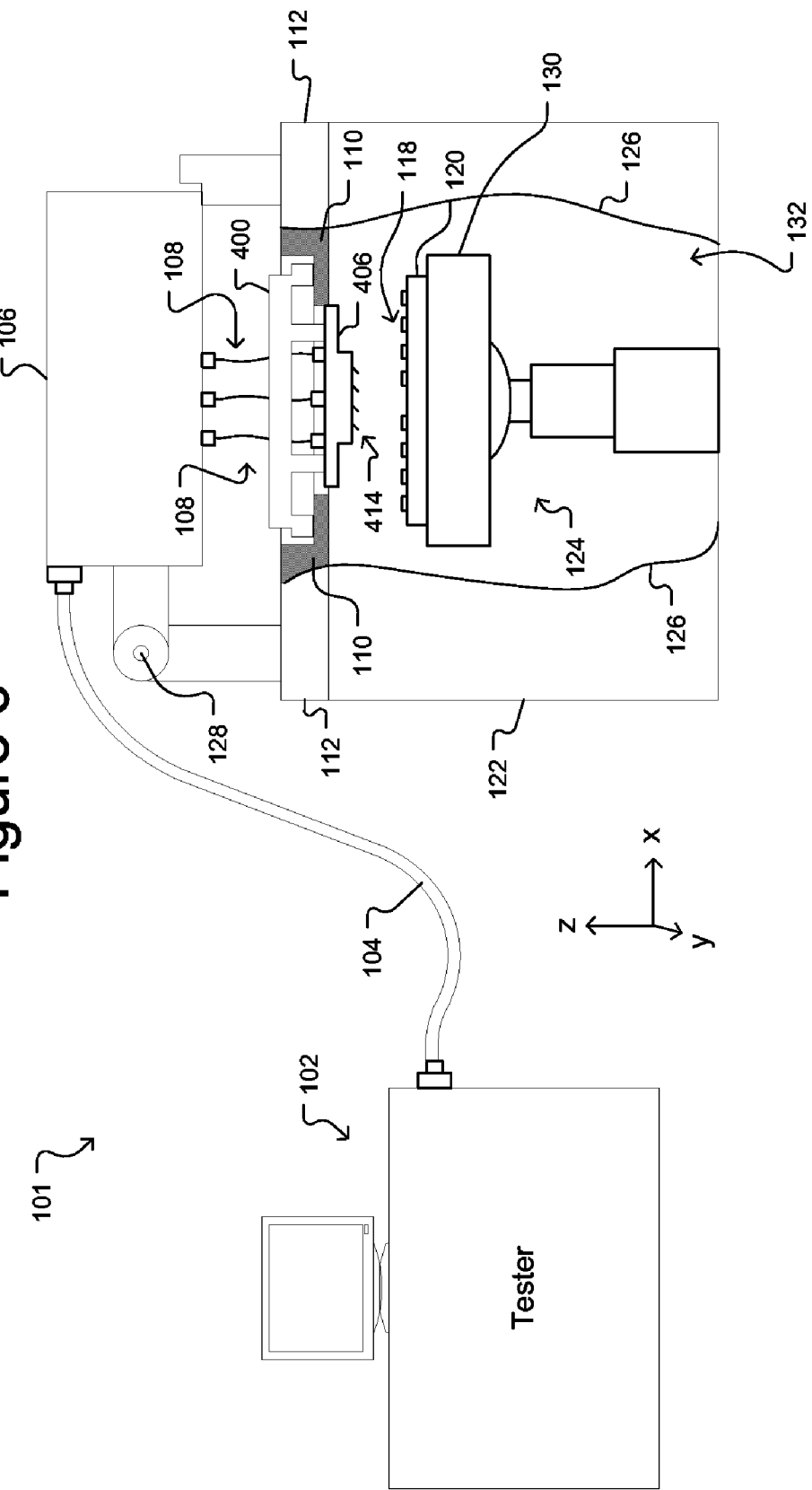
FIG. 6 illustrates an exemplary test system for testing dies of a semiconductor wafer according to some embodiments of the invention.

Referring first to the exemplary test system 101 illustrated in FIG. 6, the test system 101 is for testing DUT 120 according to some embodiments of the invention. As shown, the test system 101 can include a prober 122, which can be a box structure with an interior chamber 132 in which is disposed a movable chuck 124 having a stage 130 for holding DUT 120. (Cut out 126 in FIG. 6 provides a partial view into chamber 132.) Prober 122 can be similar to housing 422, chuck 124 can be similar to chuck 424, and stage 130 can be similar to stage 430 of FIG. 1. In some embodiments, some of the functions performed by tester 102 can be implemented in electronics (not shown) in test head 106 and/or on probe card assembly 406. Indeed, in some embodiments, tester 102 can be eliminated entirely and replaced with electronics in test head 106 and/or disposed on probe card assembly 406.

A head plate 112, which can be a solid, rigid plate-like structure, can be disposed on prober 122 and can form an upper boundary of chamber 132. Head plate 112 can include an insert ring 110 configured to hold, in normal operation, a probe card assembly 406. Electrical connectors 108 provide electrical connections between a test head 106 and probe card assembly 406, which can include electrically conductive probes 414. Probe card assembly 406 also can include electrically conductive paths (not shown in FIG. 6) between connectors 108 and probes 414.

Figure 7:
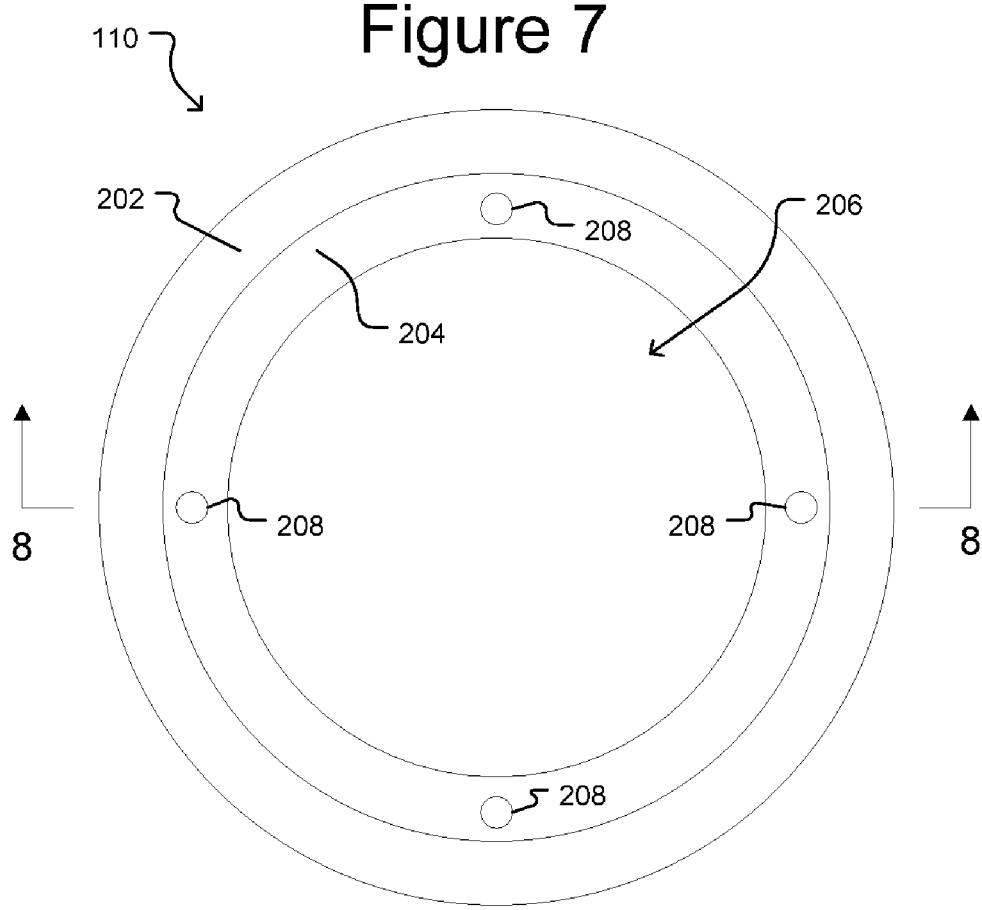
FIG. 7 illustrates a top view of the insert ring of the prober of FIG. 6.
Figure 8:
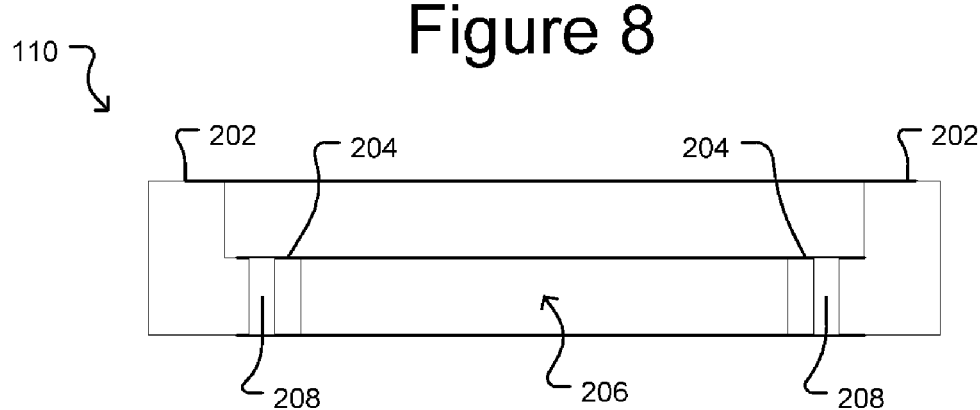
FIG. 8 illustrates a side, cross-sectional view of the insert ring of FIG. 7.

In normal operation, a probe card assembly 406 is typically bolted, clamped, or otherwise secured to insert ring 110. FIGS. 7 and 8 illustrate a top view and a cross-sectional, side view, respectively, of insert ring 110. As shown, insert ring 110 can be generally annular in shape and can include a shoulder portion 202 and a ledge 204 with bolt holes 208. In normal operation, a probe card assembly 406 can be disposed on ledge 204 with probes 414 extending out of a central opening 206 of insert ring 110, and bolts (not shown) or other securing mechanisms (e.g., clamps) can secure probe card assembly 406 to insert ring 110.

Referring again to FIG. 6, chuck 124 can include a stage 130 on which DUT 120 can be disposed. Chuck 124 can move in the "x," "y," and "z" directions, and can also tilt about the "x" and "y" axes and rotate about the "z" axis. Chuck 124 thus can align particular input and/or output terminals 118 (e.g., bond pads of a semiconductor die or dies) of DUT 120 with particular probes 414 and press those particular terminals 118 against those particular probes 414 to establish temporary electrical connections between the terminals 118 and the probes 414.

A tester 102, which can be a computer or a computer system, can provide test data to DUT 120 and analyze response data generated by DUT 120 in response to the test data. Communications cable 104 can provide a plurality of electrical data paths between tester 102 and test head 106, and test head 106 can include internal switches and other data routing elements that electrically connect the data paths provided by cable 104 with electrical connectors 108. A plurality of data channels can thus be provided between tester 102 and probes 414 through which test data from tester 102 is provided to DUT 120 and response data generated by DUT 120 in response to the test data is provided to tester 102. A rotatable arm assembly 128 can rotate test head 106 into and out of the position of the test head 106 shown in FIG. 6, which is a test position in which test head 106 is in position to test DUT 120. Cable 104 and other elements of test system 101 can be replaced in whole or in part with wireless communications devices (not shown), and as discussed above, some or all of the functions performed by tester 102 can be implemented in test head 106 and/or with electronics disposed on probe card assembly 406.

As generally discussed above with respect to FIG. 1, if the action of bringing a set of DUT 420 terminals 418 and a set of probes 414 into contact is to establish electrical connections between each of the probes 414 in the set and each of the DUT terminals 118 in the set, sufficient co-orientation should be established between the portions of probes 414 that contact terminals 118 and terminals 118. That is, prior to testing DUT 120, the positions of probes 414 should be adjusted, as needed, to put contact portions of probes 414 into an orientation (e.g., defining a surface with a particular shape, such as a plane or an approximate plane) that generally corresponds to an orientation (e.g., defining a surface with a particular shape, such as a plane or an approximate plane) of terminals 118. Moreover, during testing, the foregoing orientation of probes 414 with respect to terminals 118 should be maintained. Otherwise, it is possible that one or more probes 414 will not make physical contact—and thus not establish an electrical connection or electrical connections—with corresponding one or more terminals 118. As another possibility, it is possible that the force with which one or more probes 414 is pressed against corresponding one or more terminals 118 will be too weak to establish an electrical connection or electrical connections with a sufficient level of electrical conductivity. As discussed above, probe card assembly 406 and docking and adjustment assembly 400 can provide separate and distinct mechanisms for adjusting the orientation of probes 414 to correspond to an orientation of terminals 118.

As will be discussed below with respect to FIGS. 27-30, planarizing mechanism 410 can correct mis-orientations of probes 414 caused by irregularities and imperfections in elements of the probe card assembly 406. Examples of such irregularities and imperfections (as will be discussed with respect to FIGS. 27-30) include without limitation irregularities and imperfections in probe substrate 412, probes 414, and the mechanism (e.g., planarizing mechanism 410) that attaches probe substrate 412 to mounting fixture 408. Such irregularities and imperfections may be due to, for example, manufacturing variances. Planarizing mechanism 410 can correct such mis-orientations of probes 414 and precisely orient probes 414 with respect to a reference structure (e.g., mounting fixture 408) of probe card assembly 406.

No matter how precisely probes 414 are oriented with respect to mounting fixture 408, irregularities and imperfections in the testing apparatus (e.g., housing 422, stage 430, reference structure 402 in FIG. 1; head plate 112, insert ring 110, or stage 130 in FIG. 6) can give rise to mis-orientation of probes 414 with respect to DUT terminals 418, 118 while probe card assembly 406 is mounted in the testing apparatus. Adjustment mechanism 404 can substantially reduce and/or eliminate such mis-orientations of probes 414 with respect to DUT terminals 418, 118 caused by irregularities or imperfections in the testing apparatus to within acceptable tolerances depending on the desired result or testing situation.

FIGS. 9-12 illustrate an exemplary embodiment 700 of probe card assembly 406 according to some embodiments of the invention, which can be used in test system 101. As shown, probe card assembly 700 can comprise a stiffener 708, a wiring board 750, a probe substrate 756 with probes 758, and a plurality of actuators 702. As will be seen, stiffener 708 is one example of mounting fixture 408 and actuators 702 are one example of planarizing mechanism 410. Probe substrate 756 can be generally similar to probe substrate 412 of FIG. 1, and probes 758 can be generally similar to probes 414.

Figure 10:
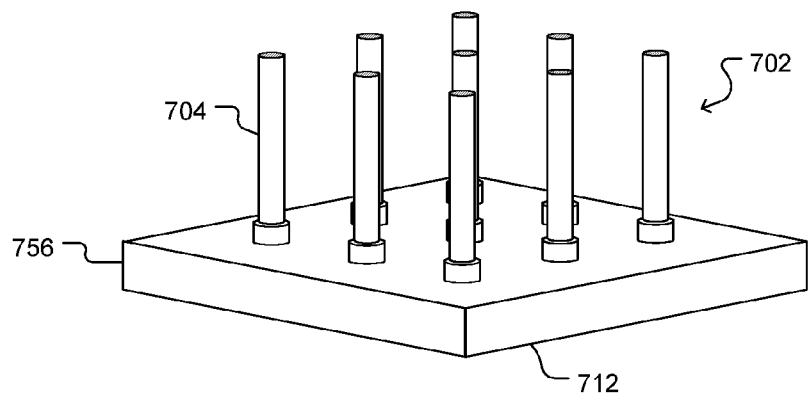
FIGS. 10-12 illustrate the probe substrate of the probe card assembly of FIG. 9.
Figure 11:
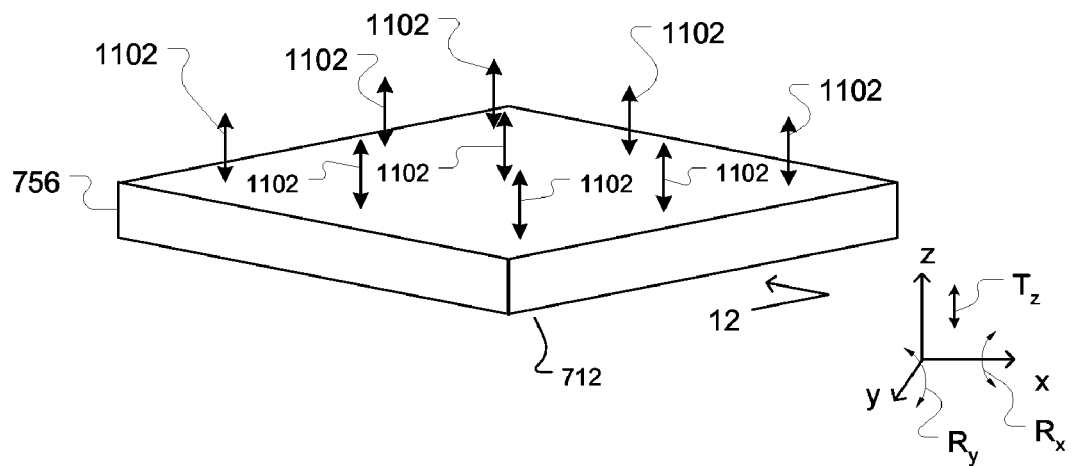
Figure 12:
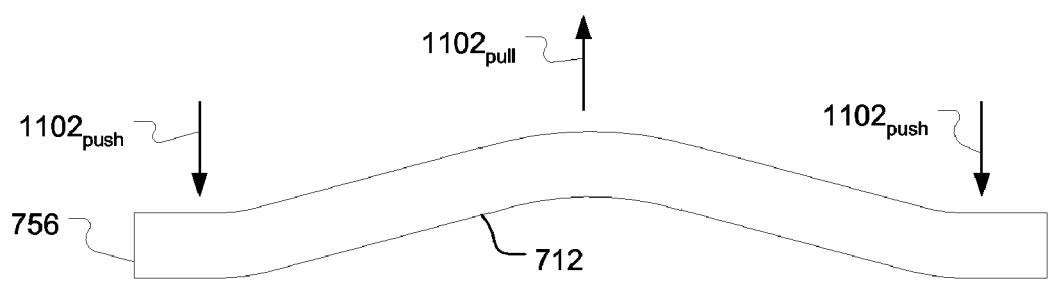

Each actuator 702 can include a moveable element 704. In the example shown in FIG. 9, each actuator 702 is attached to stiffener 708, and the moveable element 704 of each actuator 702 extends through holes (not shown) in stiffener 708 and wiring board 750 and are attached to probe substrate 756. Each moveable element 704 can be selectively moved away from or toward probe substrate 756. As a moveable element 704 is moved away from probe substrate 756, the moveable element 704 pulls the portion of probe substrate 756 to which the moveable element 704 is attached toward stiffener 708. On the other hand, as a moveable element 704 is moved toward probe substrate 756, the moveable element 704 pushes the portion of probe substrate 756 to which the moveable element 704 is attached away from stiffener 708. Each actuator 702 can thus selectively exert a push or pull force on a particular area of probe substrate 756. As shown in FIGS. 10 and 11, by utilizing a plurality of actuators 702 (nine are shown in FIG. 10 but more or fewer can be used), a plurality of push/pull forces 1102 can be applied to probe substrate 756. By selective activation of moveable elements 704, probe substrate 756 can thus be rotated ($R_x$ and $R_y$) about the "x" and/or "y" axes and translated ($T_z$) along the "z" axis. Moreover, by applying alternating push and pull forces 1102 as shown in FIG. 12, a shape of a surface 712 of probe substrate 756 can be altered. (Although not shown in FIGS. 10-12, probes 758 are attached to surface 712 of probe substrate 756.) Shapes other than the concave shape shown in FIG. 12 can be imparted to surface 712. For example, a convex shape or complex shapes that have multiple curves and/or changes of direction can be imparted to surface 712. Purely linear changes—as opposed to the curved changes shown in FIG. 12—can be made to surface 712, or as another alternative, a combination of linear and curved changes can be made.

The configuration and type of actuators 702 used is not important and many different types of actuators can be used. For example, actuators 702 can comprise differential screw assemblies that can be generally immovably attached to stiffener 708. Moveable elements 704 can be shaft portions of differential screw assemblies that are moved toward probe substrate 756 as a drive head (not shown) of the differential screw assembly is rotated in one direction and retract away from probe substrate 756 as the drive head is rotated in the other direction. As another non-limiting example, actuators 702 can comprise a housing that is attached to stiffener 708 and moveable element 704 can be a plunger or piston that can be moved in and out of the housing.

Other examples of actuators 702 include, without limitation, differential screw assemblies 404 and 2708, leveling screw assemblies 1504, and alignment/planarizing assemblies 2408 of the aforementioned U.S. patent application Ser. No. 11/165,833. FIGS. 5A-5C of the aforementioned U.S. Pat. No. 6,509,751 also illustrate examples of actuators that can be used as actuator 702. Referring again to FIG. 9, moveable element 704 can be moved using any suitable mechanism, including without limitation machine driven mechanisms such as hydraulics, motors, and piezoelectric actuators, and manually driven mechanisms such as a differential screw assembly.

Moveable element 704 need not be attached to probe substrate 756. For example, moveable element 704 can simply abut probe substrate 756, which can be attached to stiffener 708 with a spring mechanism that biases probe substrate 756 toward stiffener 708. In such a configuration, as moveable element 704 is moved toward probe substrate 756, moveable element 704 pushes a portion of probe substrate 756 away from stiffener 708. As moveable element 704 is moved away from probe substrate 756, the spring mechanism (not shown) pushes probe substrate 756 toward stiffener 708 until probe substrate 756 abuts against and is stopped by moveable element 704. An example of suitable actuators and the use of such actuators is shown in FIG. 5 of the aforementioned U.S. Pat. No. 5,974,662. As yet another possible variation, some of moveable elements 704 can be attached to probe substrate 756 and others can simply abut probe substrate 756. An example of such a configuration is shown in FIG. 2 of the aforementioned U.S. Pat. No. 6,509,751.

Referring again to FIG. 9, probe card assembly 700 also can include a wiring board 750 with connectors 752 for receiving connectors 108 from test head 106 (see FIG. 6). Electrical paths (not shown) are provided from connectors 752 through wiring board 750 to flexible electrical connectors 754 and through probe substrate 756 to probes 758. Flexible electrical connectors 754 can comprise flexible wires, one or more interposers mounted in brackets (not shown), etc.

Figure 13:
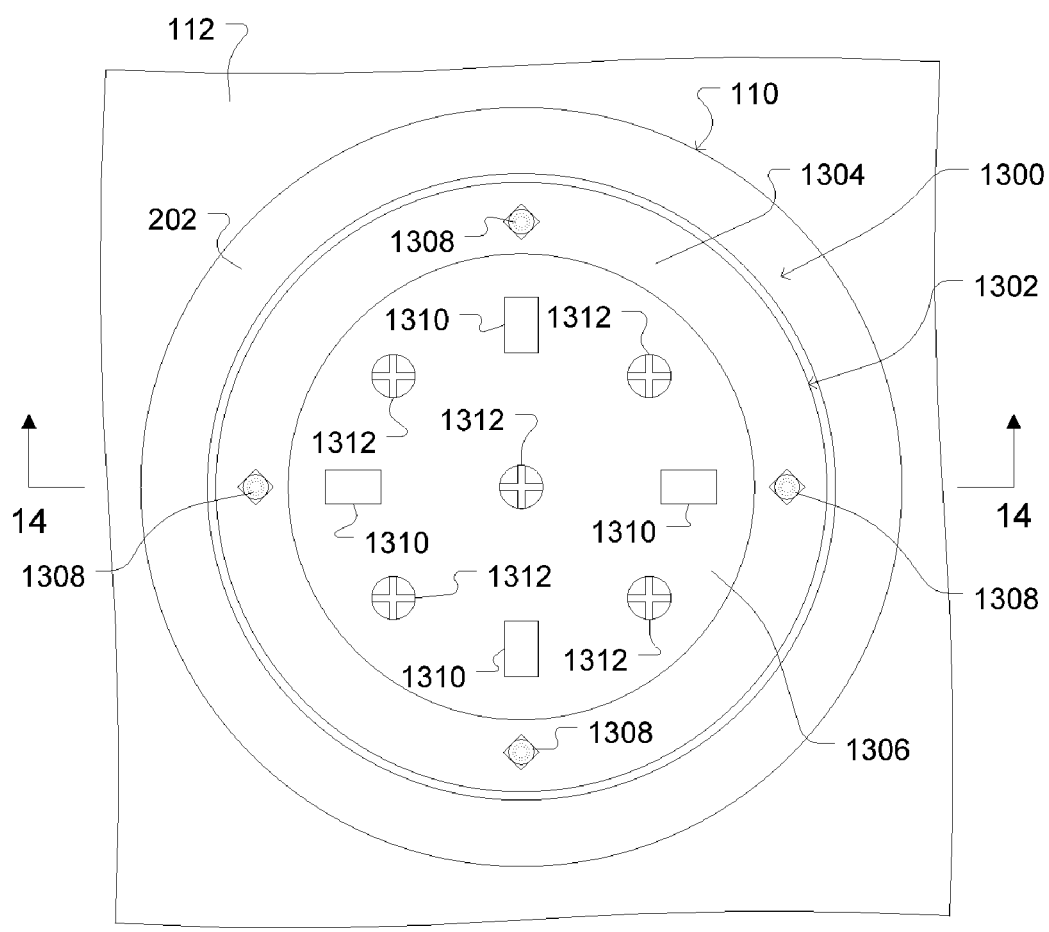
FIG. 13 illustrates a top view of an exemplary embodiment of a docking and adjustment assembly shown with partial views of the head plate and insert ring of the test system of FIG. 6 according to some embodiments of the invention.
Figure 14:
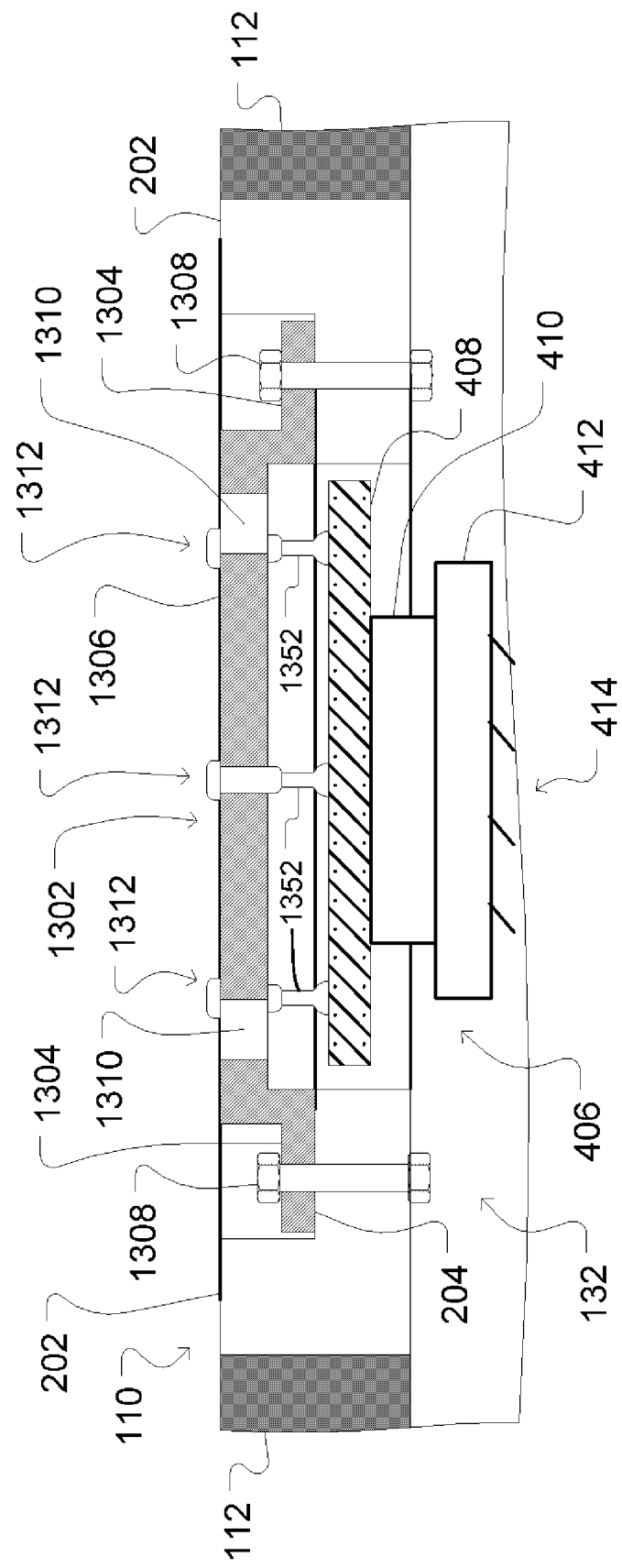
FIG. 14 shows a side, cross-sectional view of the docking and adjustment assembly of FIG. 13 with a probe card assembly.

FIGS. 13 and 14 illustrate an exemplary embodiment 1300 of docking and adjustment mechanism 400 of FIG. 1, which can be used in test system 101. FIG. 13 shows a top view of docking and adjustment mechanism 1300, which is shown attached to insert ring 110 of FIG. 6. (The insert ring 110 and head plate 112 of FIG. 6 are shown in partial view in FIG. 13.) FIG. 14 shows a side, cross-sectional view of FIG. 13.

As shown in FIGS. 13 and 14, docking and adjustment mechanism 1300 can comprise a bridge 1302 and one or more actuators 1312 (five are shown in FIG. 13 but more or fewer can be used). Bridge 1302, which can be a generally annular structure comprising metal or other rigid materials, can include a flange 1304 and a plate 1306. Flange 1304 can include holes (not shown) through which bolts 1308 secure bridge 1302 to ledge 204 of insert ring 110 (see also FIGS. 6-8). Plate 1306 can include openings 1310 for connectors 108 (not shown in FIGS. 13 and 14), which as discussed above, can connect test head 106 to probe card 406. (See FIG. 6.) The bridge 1302 illustrated in FIGS. 13 and 14 is exemplary only and many variations are possible. For example (and without limitation), the general shape of bridge 1302 may be other than annular.

In the embodiment of docking and adjustment assembly 1300 shown in FIGS. 13 and 14, actuators 1312 are attached to both plate 1306 of docking and adjustment assembly 1300 and mounting fixture 408 of probe card assembly 406, which is shown in FIG. 14 as generically including at least a mounting fixture 408, a planarizing mechanism 410, a probe substrate 412, and probes 414 as previously discussed with regard to FIGS. 1-5. In the embodiment shown in FIGS. 13 and 14, actuators 1312 both attach probe card assembly 406 to docking and adjustment assembly 1300 and adjust an orientation of probe card assembly 406 with respect to bridge 1302. Thus, in the exemplary embodiment of docking and adjustment assembly 1300 shown in FIGS. 13 and 14, bridge 1302 is an exemplary implementation of reference structure 402 and actuators 1312 are an exemplary implementation of adjustment mechanism 404 of the docking and adjustment mechanism 400 of FIG. 1.

Actuators 1312, which can be generally similar to actuators 702, include a moveable element 1352, which can be generally similar to moveable element 704. In the example shown in FIGS. 13 and 14, actuator 1312 can be attached to plate 1306, and moveable element 1352 can be attached to mounting fixture 408. As moveable element 1352 is moved away from mounting fixture 408, moveable element 1352 pulls probe card assembly 406 towards bridge 1302. Moving element 1352 in the opposite direction, pushes probe card assembly 406 away from bridge 1302. By spacing a plurality of actuators 1312 about plate 1306 as shown in FIG. 13, probe card assembly 406 can be rotated about the "x" and/or "y" axes and translated along the "z" axis as generally shown in FIG. 4, among other figures. By applying pushing forces against probe card assembly 406 with one or more actuators 1312 and pulling forces with one or more other actuators 1312, the shape of probe card assembly 406 can be altered as generally shown in FIG. 5, among other figures.

The actuator 1312 can be attached to plate 1306 in any suitable manner. For example, a portion of each actuator 1312 can be threaded into a threaded opening (not shown) in plate 1306. As other examples, a portion of actuator 1312 can be welded, brazed, screwed, bolted, clamped, adhered, etc. to plate 1306. Moveable element 1352 can be attached to mounting fixture 408 in any suitable manner, including without limitation threaded into or welded, brazed, screwed, bolted, clamped, or adhered to mounting fixture 408.

Figure 15:
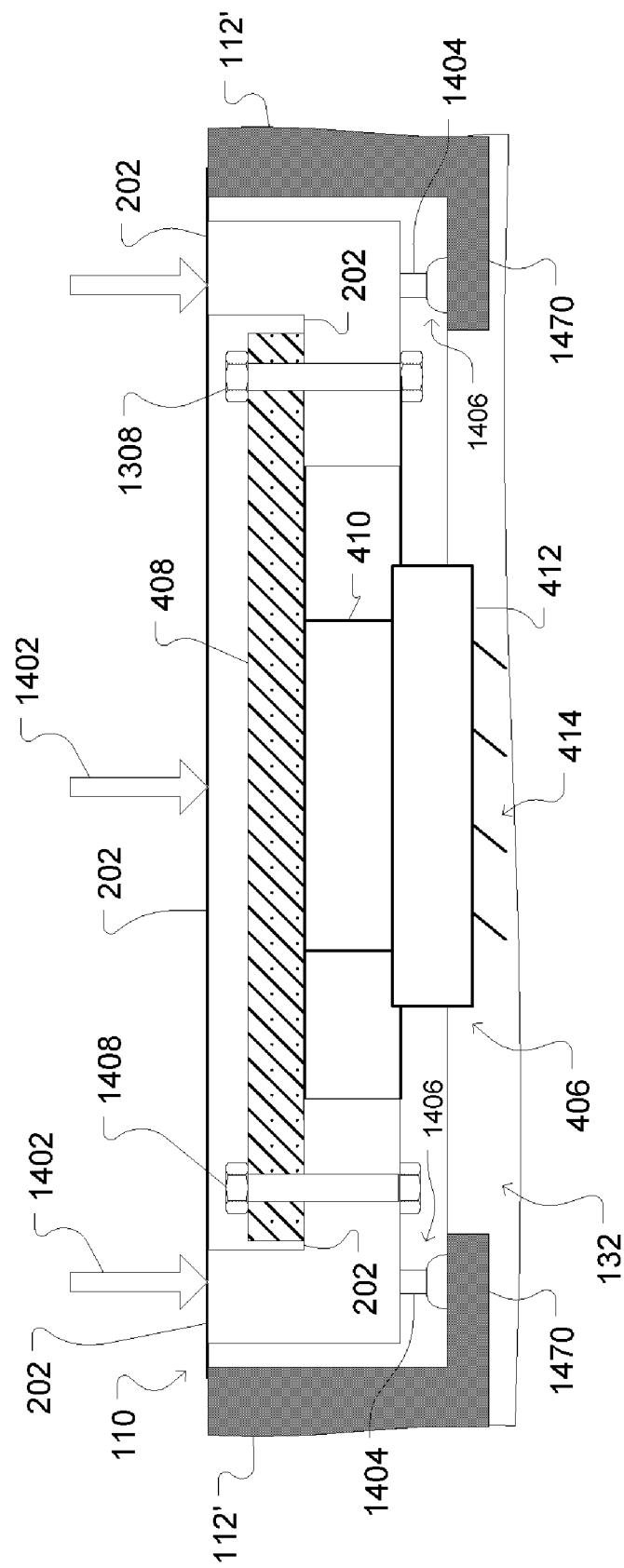
FIG. 15 illustrates a side, cross-sectional view of another exemplary embodiment of a docking and adjustment assembly shown with partial views of the head plate and insert ring according to some embodiments of the invention.

FIG. 15 illustrates a partial view of an alternative head plate 112' that can include shoulders 1470 according to some embodiments of the invention. A probe card assembly 406 can be fastened (e.g., with bolts 1408 or other fasteners, such as screws, clamps, etc.) to insert ring 110, as shown in FIG. 15. As also shown in FIG. 15, insert ring 110 can be disposed on actuators 1406 that are, in turn, disposed on shoulders 1470 of head plate 112'. The actuators 1406, which can be like actuators 702 or 1312 and include a moveable element 1404 (which can be like moveable element 704 or 1352) can move the insert ring 110 toward or away from shoulder 1470. By utilizing a plurality of such actuators 1406, an orientation of insert ring 110 (and thus probe card assembly 406) can be changed with respect to head plate 112'. In the example shown in FIG. 15, actuators 1406 can be attached to shoulders 1470, and moveable element 1404 can abut against insert ring 110. Biasing forces 1402 (e.g., springs disposed between insert ring 110 and test head 106 (see FIG. 6) can bias insert ring 110 toward shoulders 1470. Alternatively, actuators 1406 can be attached to insert ring 110, and moveable element 1404 can abut against shoulders 1470. As yet another alternative, moveable elements 1404 can be attached to insert ring 110 so that moveable elements 1404 can both push insert ring 110 away from shoulders 1470 and pull insert ring 110 toward shoulders 1470. In such a case, biasing forces 1408 need not be used.

Figure 17:
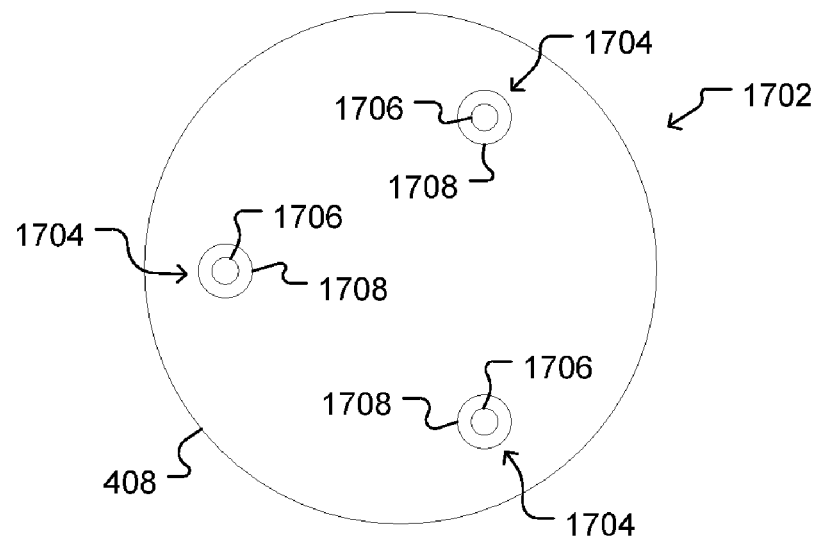
FIG. 17 illustrates a top view of an exemplary probe card assembly that can be used with the head plate and insert ring of FIGS. 16A and 16B.
Figure 18:
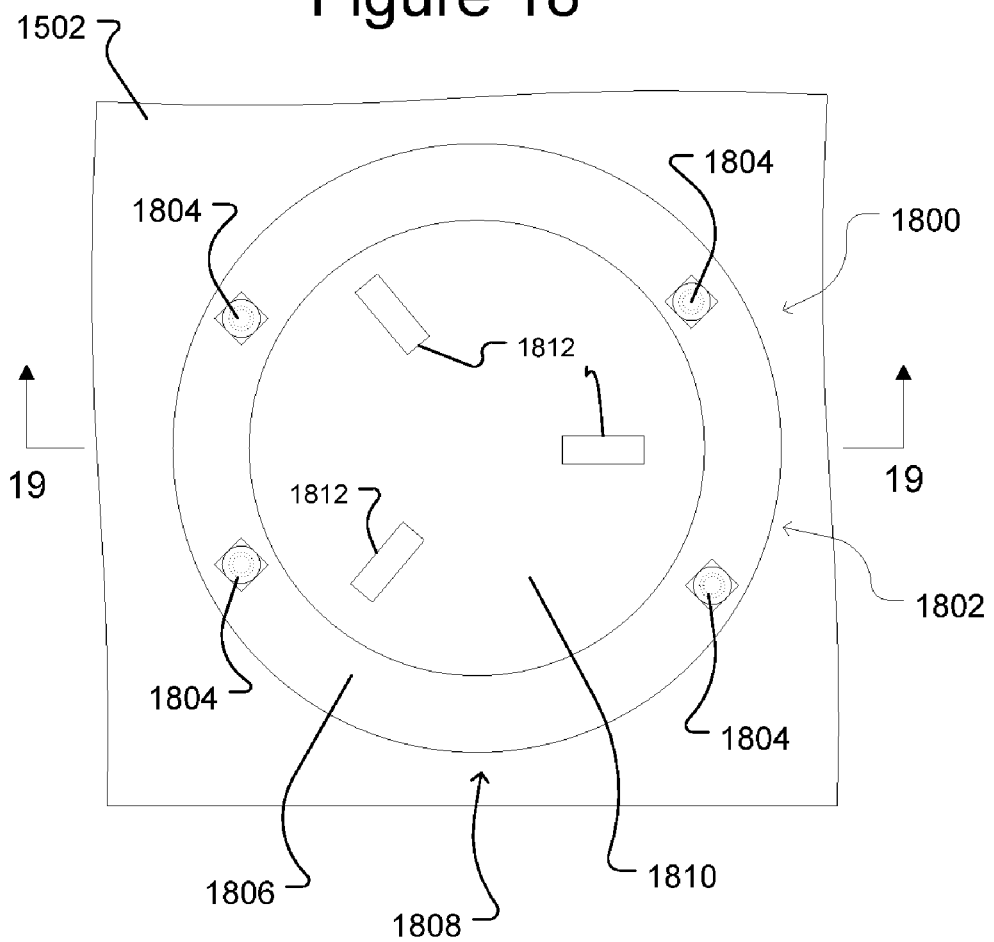
FIG. 18 illustrates a top view of an exemplary docking and adjustment assembly attached to the head plate and insert ring of FIGS. 16A and 16B, which are shown in partial view, according to some embodiments of the invention.
Figure 19:
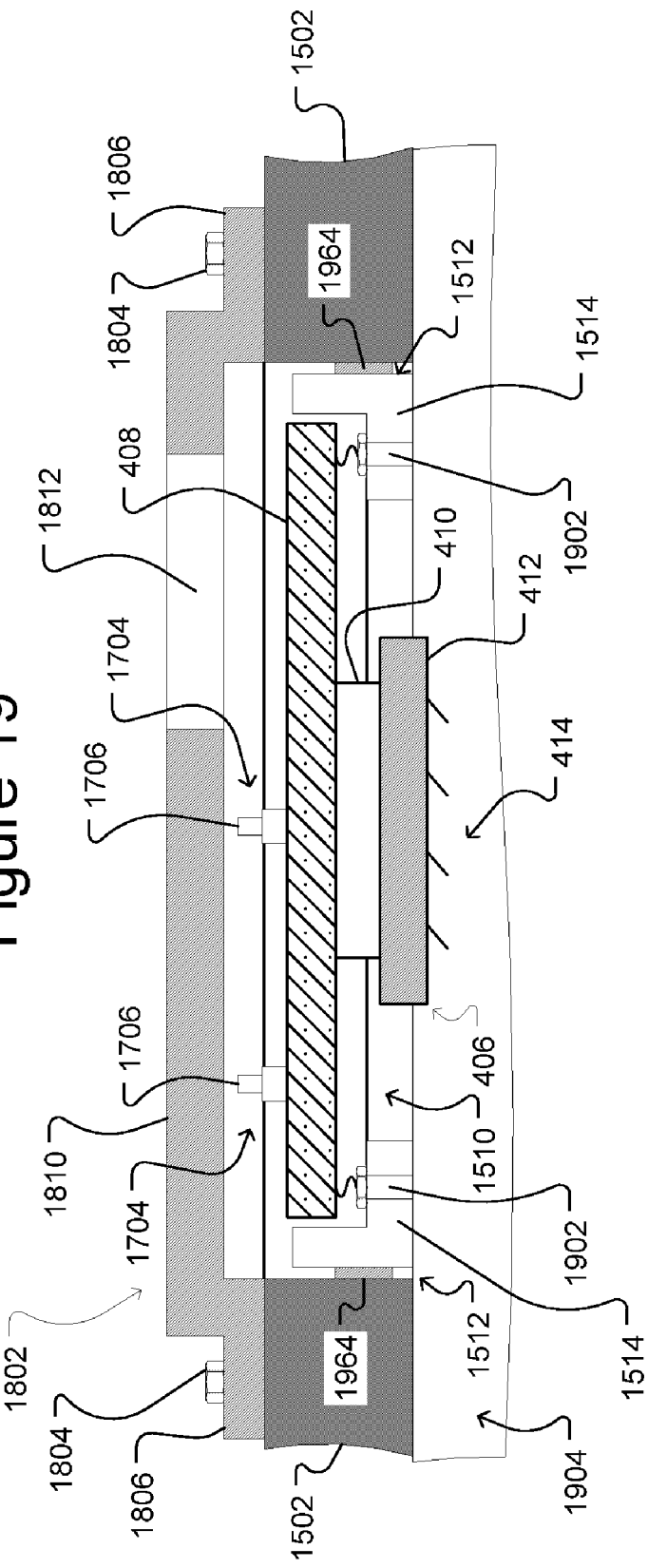
FIG. 19 shows a side, cross-sectional view of the docking and adjustment assembly of FIG. 18 with the probe card assembly of FIG. 17.

FIGS. 16A and 16B illustrate a partial view of yet another alternative head plate 1502 and insert ring 1512 that can be used in place of head plate 112 and insert ring 110 of FIG. 6, and FIGS. 17-19 illustrate an exemplary embodiment 1702 of probe card assembly 406 and an exemplary embodiment 1800 of docking and adjustment mechanism 400 that can be used with head plate 1502 and insert ring 1512 in test system 101 of FIG. 6 according to some embodiments of the invention. The probe card assembly 1702 shown in FIGS. 17-19 and the docking and adjustment assembly 1800 shown in FIGS. 18 and 19 are thus further exemplary embodiments of the probe card assembly 406 and docking and adjustment assembly 400 shown in FIGS. 1 and 6.

Referring first to FIGS. 16A and 16B, head plate 1502, which can include central opening 1506, can be generally similar to head plate 112 shown in FIG. 6. Insert ring 1512, however, can slide from an exposed position shown in FIG. 16A to a test position (shown in FIG. 16B) within an opening (not shown) in head plate 1502. A sliding mechanism 1964 along which insert ring 1512 can slide is shown in dashed lines in FIGS. 16A and 16B because sliding mechanism 1964 is hidden from view in FIGS. 16A and 16B. The sliding mechanism 1964 can comprise rails attached to head plate 1502 along which wheels, bearings, or other moveable mechanisms (not shown) attached to insert ring 1512 roll, slide, or otherwise move. Insert ring 1512 can include an opening 1510, ledge 1514 with holes 1508, and a shoulder 1518 generally like insert ring 110 of FIGS. 7 and 8.

In typical use, while insert ring 1512 is in the exposed position shown in FIG. 16A, a probe card assembly (not shown in FIGS. 16A and 16B) is placed on ledge 1514 with its probes (not shown) extending through opening 1510 (into the page in FIG. 16). Using bolt holes 1508, the probe card assembly is then bolted to ledge 1514, and insert ring 1512 is pushed into head plate 1502 into what is referred to above as a test position (shown in FIG. 16B). In the test position, insert ring 1512 is disposed within head plate 1502 and opening 1506 in head plate 1502 is generally aligned with opening 1510 in insert ring 1512. In the test position, the probe card assembly is ready to contact a DUT.

FIG. 17-19 illustrate exemplary embodiments of a probe card assembly 1702 and docking and adjustment assembly 1800 configured for use in prober 122 (see FIG. 6) modified to comprise head plate 1502 and insert ring 1512 of FIGS.

16A and 16B according to some embodiments of the invention. More specifically, FIG. 17 shows a top view of probe card assembly 1702, and FIG. 18 shows a top view and FIG. 19 shows a side, cross-sectional view of probe card assembly 1702 and docking and adjustment assembly 1800 mounted in head plate 1502 and insert ring 1512, each of which is shown in partial view only.

As shown in FIGS. 17 and 19, probe card assembly 1702 comprises a mounting fixture 408, planarizing mechanism 410, probe substrate 412, and probes 414, which can be as described above with respect to FIG. 1. As also shown, a plurality of actuators 1704 are attached to mounting fixture 408 of probe card assembly 406. (Three actuators 1704 are shown in the exemplary configuration illustrated in FIGS. 17-19 (the view illustrated in FIG. 19 shows only two of the three actuators 1704) but fewer or more can be used.) Each actuator 1704 can be generally similar to any of actuators 702, 1312, 1406 and can include a moveable element 1704, which can be generally similar to moveable element 704, 1352, 1404. In the example shown in FIGS. 17-19, actuators 1704 can be attached to mounting fixture 408, and moveable element 1706 can abut against plate 1810. (Actuator 1704 can be attached to mounting fixture 408 in any suitable manner, including without limitation any of the attachment methods described above for attaching actuator 1312 to plate 1306.)

As shown in FIGS. 18 and 19, docking and adjustment assembly 1800 comprises a bridge 1802, which can be generally annular in shape and comprise a flange 1806 and plate 1810. Bridge 1802 can comprise metal or other such materials. Flange 1806 can include holes (not shown) for bolts 1804 that bolt bridge 1800 to head plate 1502 through holes 1504 in head plate 1502. (See FIG. 16.) Bridge 1802 can include openings 1812 for connectors 108, which as discussed above with respect to FIG. 6, can electrically connect test head 106 to probe card assembly 406.

Referring to FIGS. 16-19, in use, spring plugs 1902 can be inserted (e.g., threaded) into holes 1508 in ledge 1514 of inset ring 1512. Insert ring 1512 is moved to the exposed position shown in FIG. 16A, and probe card assembly is placed onto the springs of spring plugs 1902, which provide a biasing force that pushes probe card assembly 406 in the direction of bridge 1802. Alternatively, spring plugs 1902 can be attached to insert ring 1512. With moveable elements 1706 of actuators 1704 generally retracted, insert ring 1512 is moved into the test position (shown in FIG. 16B), which as described above and shown in FIG. 16B, is generally inside head plate 1502. Moveable elements 1706 of actuators 1704 are then extended such that they press against plate 1810. By selective activation of actuators 1704, probe card assembly can be rotated about the "x" and/or "y" axes and also translated in either direction along the "z" axis as generally shown in FIG. 4. A shape of probe card assembly 406 can also be altered as generally shown in FIG. 5.

Actuators 1704 can be actuated (e.g., moveable element 1706 moved) in any suitable manner including without limitation any of the ways discussed above for actuating actuator 1312 of FIG. 15. In addition, actuators 1704 can be placed on plate 1810 rather than on mounting fixture 408. For example, actuators 1704 can be attached to the lower (with respect to FIG. 19) surface of plate 1810 with shafts 1706 extending downward (with respect to FIG. 19) to contact the upper (with respect to FIG. 19) surface of mounting fixture 408.

Figure 20:
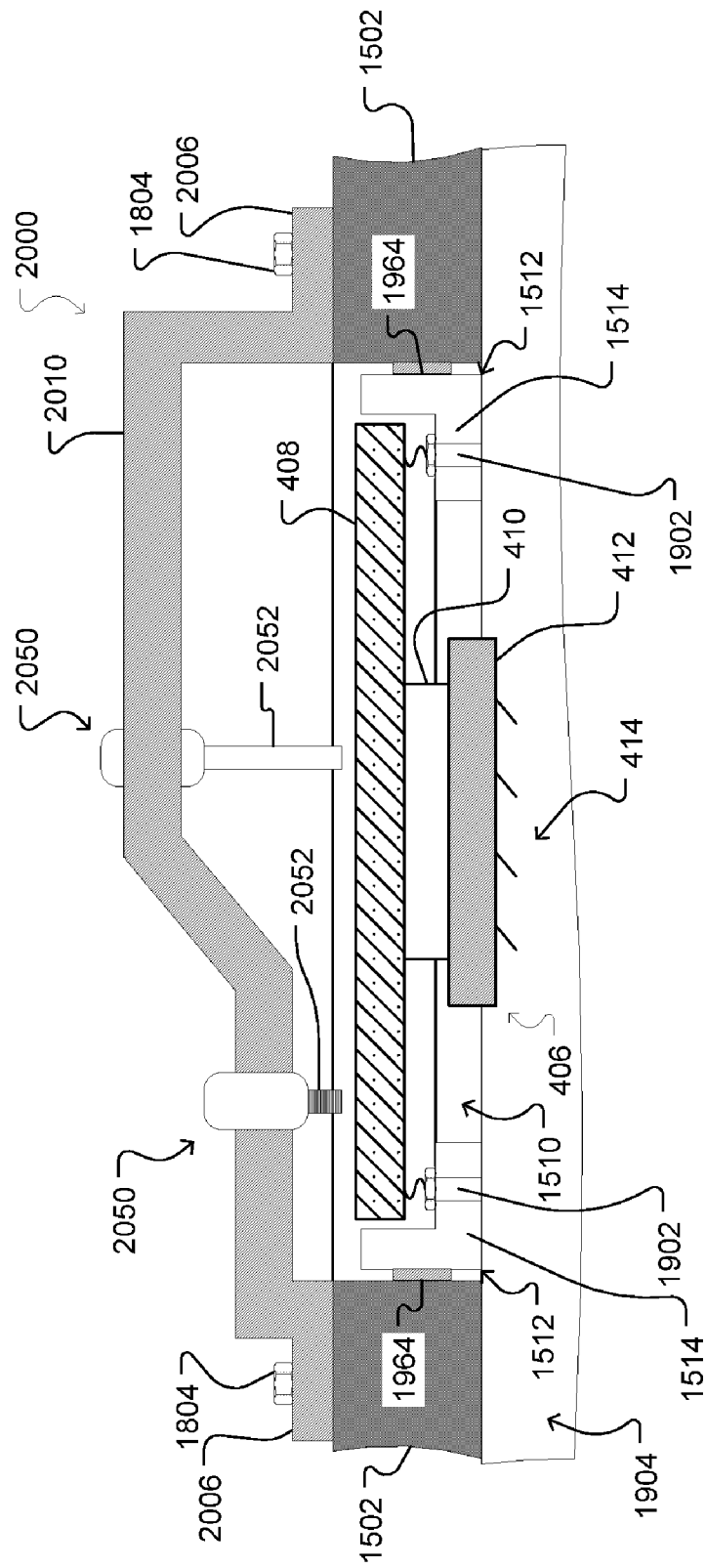
FIG. 20 shows an alternative docking and adjustment assembly and probe card assembly that can be used in place of the docking and adjustment assembly and probe card assembly of FIG. 19 according to some embodiments of the invention.

FIG. 20 illustrates exemplary variations of bridge 1802 of FIGS. 17-19. FIG. 20 is generally the same as FIG. 19 except, in FIG. 20, bridge 2000 replaces bridge 1802 and actuators 2050 replace actuators 1704. As shown, bridge 2000 can include a flange 2006 that can be generally similar to flange 1806 and a plate 2010 that can be generally similar to plate 1810 except that plate 2010 does not present an even or flat surface to probe card assembly 406. Each actuator 2050 can be similar to any of actuators 702, 1312, 1406, 1704 and can include a moveable element 2052 that can be selectively advanced toward mounting fixture 408 and thus push probe card assembly 406 away from plate 2010, or retracted away from mounting fixture 408, allowing springs of spring plugs 1902 to push probe card assembly 406 toward plate 2010. Again, by selective use of a plurality of such actuators 2050, probe card assembly 406 can be rotated about the "x" and/or "y" axes and translated in either direction along the "z" axis as shown in FIG. 4.

Figure 21B:
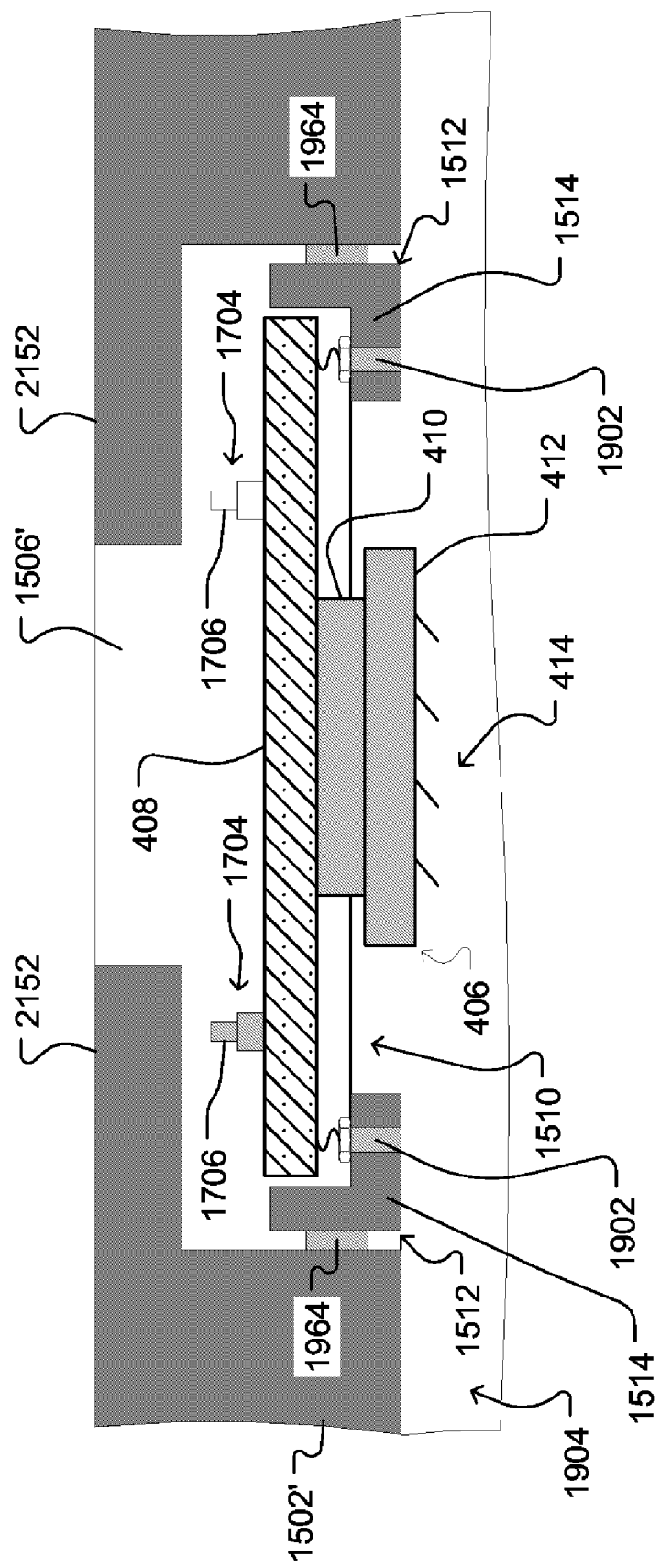

FIGS. 21A (top view) and 22B (side, cross-sectional view) illustrate still another alternative head plate 1502', insert ring 1512, and probe card assembly 406 according to some embodiments of the invention. Insert ring 1512 and probe card assembly 406, which includes actuators 1704, can be generally the same as shown in FIG. 19. Head plate 1502' can also be generally similar to head plate 1502 of FIG. 19, except head plate 1502' includes extension portion 2152 as shown in FIGS. 21A and 21B. Because of extension portion 2152, bridge 1802 (see FIG. 19) is not needed, and extension portion 2152 generally replace bridge 1802 of FIG. 19. That is, moveable elements 1706 of actuators 1704 can abut against extension portion 2152 and selectively push portions of probe card assembly 406 away from extension portion 2152 against the biasing force of spring plugs 1902. As discussed above, spring plugs 1902 can alternatively be attached to probe card assembly 406 (e.g., to mounting fixture 408).

Figure 22:
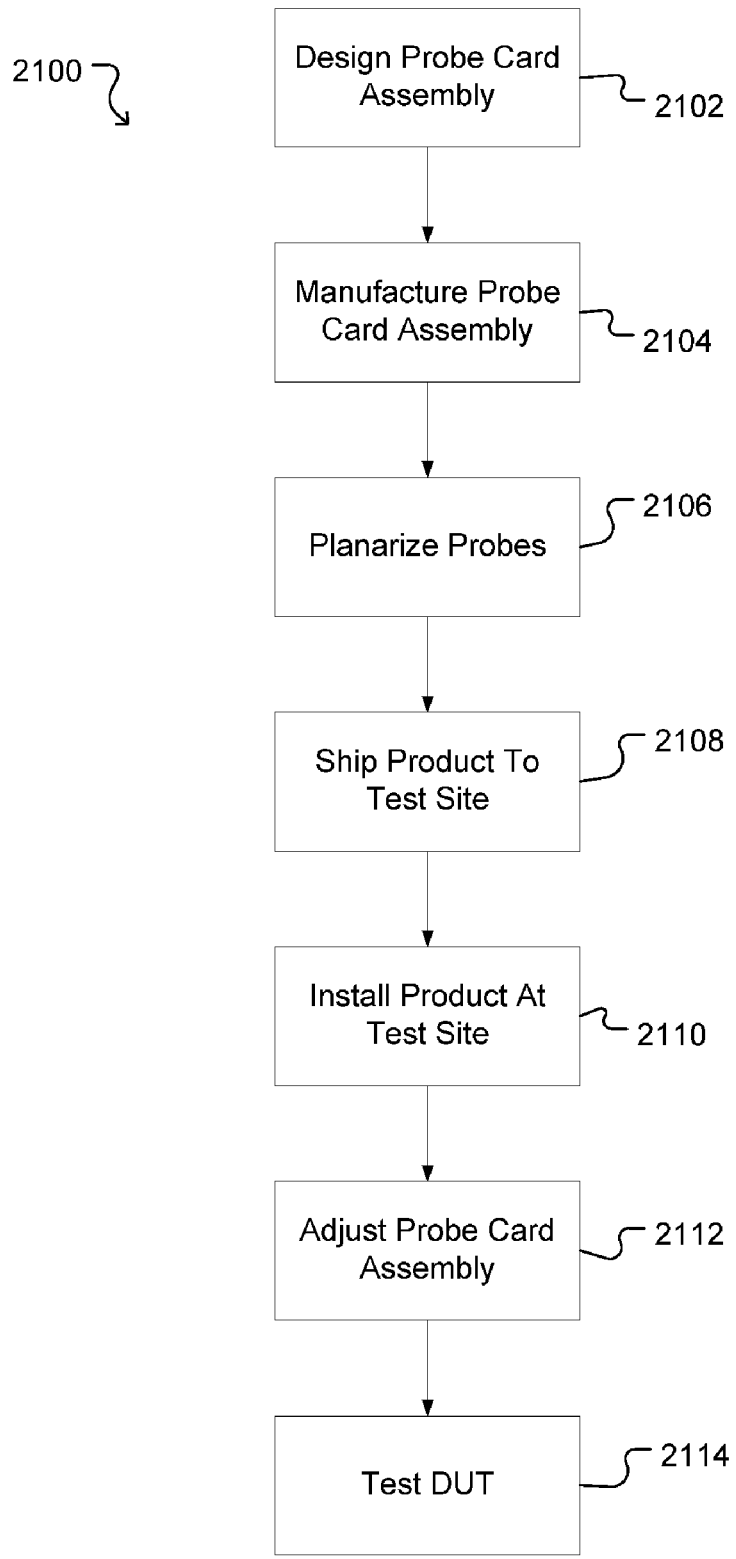
FIG. 22 illustrates an exemplary process for designing, making, and using a probe card assembly according to some embodiments of the invention.

FIG. 22 illustrates an exemplary process 2100 for designing, making, and using a probe card assembly, such as probe card assembly 406. As shown, process 2100 begins with designing the probe card assembly 406 (2102), which can include, among other things, laying out probes to correspond to the input and/or output terminals 418 of DUT 420. Typically, a probe 414 can be provided for each DUT terminal 418, and the probes 414 can be laid out in a configuration that corresponds to the layout of DUT terminals 418. Of course, designing a probe card assembly 406 also can include other considerations, such as providing electrical paths through the probe card assembly 406 to electrically connect particular probes 414 to particular data channels from the tester.

Once the probe card assembly 406 is designed (2102), the probe card assembly can be manufactured and assembled (2104). Referring to the exemplary probe card assembly 406 shown in FIG. 1, probes 414 can be attached to probe substrate, and probe substrate 414, mounting fixture 408, and planarizing mechanism 410 can be assembled. Once the probe card assembly 406 is assembled (2104), planarizing mechanism 408 can be utilized to planarize contact tips of probes 414, as generally discussed above. For example, as discussed above, planarizing mechanism 408 can correct mis-orientation of probes 414 caused by irregularities and imperfections in elements of the probe card assembly 406. Non-limiting examples include irregularities and imperfections in probe substrate 412, probes 414, and/or the mechanism that attaches probe substrate 412 to mounting fixture 408. As will be discussed with respect to the multi-probe substrate probe card assembly 406' illustrated in FIG. 27, one planarizing mechanism 410' can correct mis-orientation of one set of probes 414' on one probe substrate 412' and another planarizing mechanism 410" can independently correct mis-orientation of another set of probes 414" on another probe substrate 412". Planarizing mechanisms 410', 410" can also orient each set of probes 414', 414" such that the array 2702 formed by probes 414', 414" is oriented as desired (e.g., in a plane or an approximate plane).

At 2108, a product that can include the probe card assembly 406 can be shipped to a test site for installation in a test system such as test system 401 of FIG. 1 or test system 101 of FIG. 6. At the test site, the product can be installed in a housing like housing 422 of FIG. 1 or a prober like prober 122 of FIG. 6 (2110). The product shipped can be just the probe card assembly 406, the probe card assembly 406 coupled with an adjustment mechanism 404, a probe card assembly 406 coupled with an adjustment mechanism 404 and a reference structure 402, or any combination of the foregoing.

The exemplary probe card 406 and docking and adjustment assembly comprising bridge 1302 and actuators 1312 is an example of the later. That is, the exemplary probe card 406 and docking and adjustment assembly comprising bridge 1302 and actuators 1312 shown in FIG. 14 can be assembled into a single product, which is then shipped at 2108 to a test site, where it can be installed at 2110 as a single product onto the insert ring 110 of a prober 122 as shown in FIGS. 6 and 14.

The exemplary probe card 406 and docking and adjustment assembly comprising bridge 1802 and actuators 1704 illustrated in FIG. 19 is an example in which the product shipped at 2108 can include both a probe card assembly 406 and an adjustment mechanism 408. That is, before shipping at 2108, actuators 1704 can be attached to the mounting fixture 408 of probe card assembly 406 and a product comprising probe card assembly 406 with attached actuators 1704 can be shipped to a test site at 2108. The test site can include a prober 122 with a head plate 1502 to which bridge 1802 was previously attached as shown in FIG. 19. At the test site, probe card assembly 406, which can include actuators 1704, can be installed in prober 122 at 2110 by placing the probe card 406 with attached actuators 1704 in insert ring 1512 as shown in FIG. 19.

The probe card assembly 406 of FIG. 20 illustrates an example in which just the probe card assembly 406 is shipped at 2108. That is, at 2108, the probe card assembly comprising mounting fixture 408, planarizing mechanism 410, and probe substrate 412 with probes 414 is shipped at 2108 to a test site that can include a prober 122 having head plate 1502 to which a bridge 2000 with actuators 2050 was previously attached as shown in FIG. 20. The probe card assembly 406 can then be installed in prober 122 at 2110 by placing the probe card assembly 406 in insert ring 1512 as also shown in FIG. 20.

Once installed at 2110, the orientation of the probe card assembly 406 with respect to reference structure 402 can be adjusted as needed at 2112. As described above (e.g., with respect to FIGS. 4 and 5, among other figures) and as will be described below with respect to FIGS. 28-30, adjustment mechanism 404 can correct mis-orientations of probes 414, 414', 414" and probe array 2702 caused by imperfections and irregularities in the testing apparatus.

Once the probe card assembly 406 is installed in prober 122 at 2110 and adjusted at 2112, the test system 101, 401 tests DUT 120 at 2114. A new probe card assembly design for testing a new DUT with a different arrangement of terminals may be implemented by simply designing a new probe substrate with new probes disposed to correspond to the layout of the terminals of the new DUT and then replacing the original probe substrate 412 of probe card assembly 406 with the new probe substrate.

Figure 23:
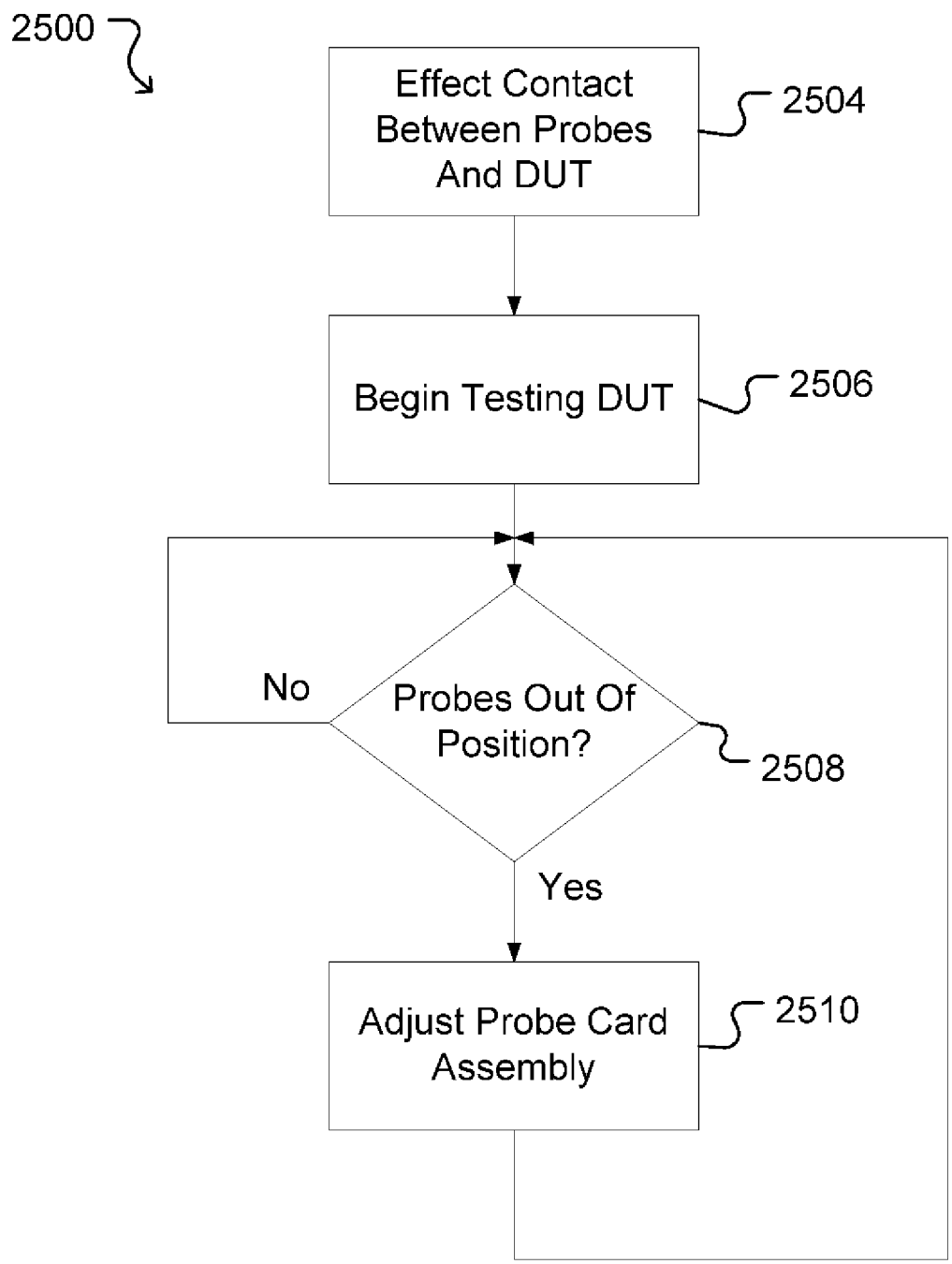
FIG. 23 illustrates an exemplary process for performing the step of testing a DUT from the process of FIG. 22.

FIG. 23 illustrates an exemplary process 2500 for testing DUT at 2114 of FIG. 22 in which docking and adjustment assembly 400 can be utilized during testing of DUT. A shown in FIG. 23, process 2500 begins with effecting contact between probes 414 and DUT terminals 418 (2504). As discussed above, DUT terminals 418 can be brought into contact with probes 414 by moving chuck 124 and holding probe card assembly 406 stationary. Alternatively, however, adjustment mechanism 404 can move probe card assembly 406 into contact with DUT 420, which need not move. As yet another alternative, both DUT 420 and probes 414 can be moved to effect contact (2504).

At 2506, testing of DUT 420 is started. During testing, the positions of probes 414 with respect to DUT terminals 418 are monitored (2508), which can be accomplished by sensing positions of DUT 420 (and/or DUT terminals 418) with respect to probe card assembly 406 (and/or probes 414). Positions of DUT 420 (and/or terminals 418) and probe card assembly 406 (and/or probes 414) can be determined in any suitable manner including through the use of capacitive sensor or optical sensor (e.g., one or more cameras). Alternatively, force or strain sensors can be used to detect mechanical shifts. If it is determined at 2508 that the probes 414 are out of position with respect to DUT terminals 418 (2508—yes), the orientation of probe card assembly 406 can be adjusted at 2510 using adjustment mechanism 404. For example, signals output by capacitive or optical sensors or force or strain gauges can be used to drive adjustment mechanism 404. Alternatively or in addition, the position of chuck 424 can be changed. The monitoring (2508) and adjusting (2510) can continue to be executed throughout testing of the DUT 420. As another alternative, adjusting (2510) can be executed between testing of different DUTs. For example, after testing a first DUT 420 or set of DUTs, the positions of probes 414 can be checked and adjusted as needed as discussed above with respect to 2510. Thereafter, a second DUT or set of DUTs can be tested. Of course, provisions can be made in the process 2500 of FIG. 22 to terminate the process, handle errors, etc.

The process of FIG. 23 can be implemented in hardware and/or software (as used herein the term software includes without limitation any form of software, firmware, microcode, etc., or any combination of the foregoing) or any combination thereof. For example, the system 2400 shown in FIG. 24 can be configured to execute process 2500 of FIG. 23. Processor 2402 can be any digital controller, computer, or computing device and can be configured to operate under control of software stored in memory 2408. (Memory 2408 can be any memory device including without limitation semiconductor, magnetic, or optical based memory devices, and memory 2408 can be volatile or non-volatile memory.) Processor 2402 can executes 2504 and 2510 of process 2500 by sending control data to actuators 2406 that compose adjustment mechanism 404. Processor 2402 can receive data regarding the relative positions of probes 414 and DUT terminals 418 through sensor 2404 (which can be, without limitation, one or more optical sensors, capacitive sensors, strain gauges, force gauges, etc.).

Figure 25:
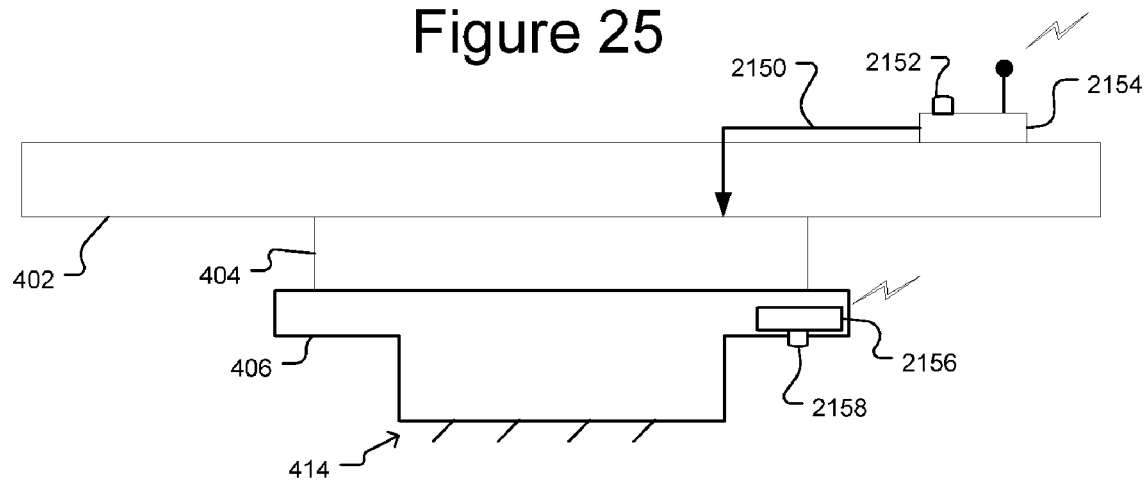
FIG. 25 illustrates an exemplary embodiment of a probe card assembly that can include wireless transmission of data relating to probe card assembly according to some embodiments of the invention.

FIG. 25 illustrates yet another exemplary embodiment. As shown, probe card assembly 406 can include a memory circuit 2156 having an embedded transmitter (not shown) for storing data regarding probe card assembly 406 and wirelessly transmitting (e.g., using radio frequency transmission techniques, infrared transmission techniques, etc.) the data to a controller 2154. For example, memory 2156 can store data representing predetermined settings for adjustment mechanism 404. That is, memory 2156 can store settings for adjustment mechanism 404 that have previously been determined will orient probe card assembly 406 to render probes 414 co-planar with DUT terminals 418. A button 2158 or other trigger device can cause memory 2156 to transmit the settings data.

Controller 2154, which can include an embedded receiver (not shown), receives the settings data transmitted by memory 2156 and provides control signals 2150 to adjustment mechanism 404, causing adjustment mechanism 404 to orient probe card assembly 406 in accordance with the settings data transmitted by memory 2156. Controller 2154 can also be configured to transmit settings data to memory 2156 for storage, and such transmission can be triggered by button 2152. For example, a probe card assembly 406 can be mounted in prober 122 and oriented using adjustment mechanism 404 such that probes 414 are co-planar with DUT terminals 418. Button 2152 can then be activated, causing controller 2154 to transmit settings data for adjustment mechanism 404 to memory 2156, where the settings data is stored. Memory 2156 and/or controller 2154 can alternatively or additionally be configured to transmit data to or receive data from any other nearby device, machine, or apparatus. For example, memory 2156 can transmit data regarding the probe card assembly 406 to tester 102 (see FIG. 6).

Controller 2154 and memory 2156 can be implemented using any suitable electronics including without limitation analog circuits, digital logic circuits, a processor operating under control of software, or any combination of the foregoing.

Figure 26:
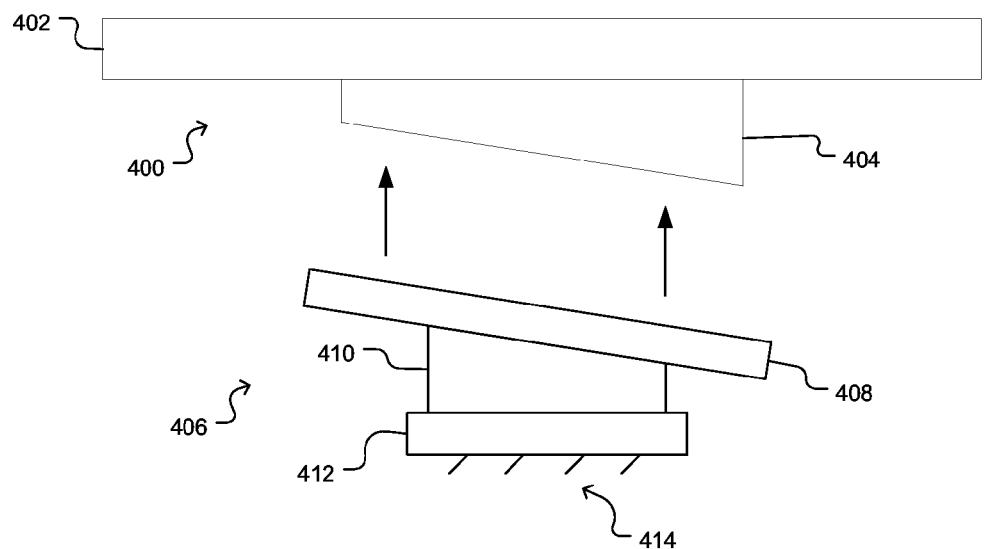
FIG. 26 illustrates use of a docking and adjustment assembly as a key that prevents the use of unauthorized probe card assemblies according to some embodiments of the invention.

FIG. 26 illustrates the use of a docking and adjustment assembly 400 as a key that allows only similarly keyed probe card assemblies to be docked. As shown in FIG. 26, adjustment mechanism 404 is intentionally set to provide non-planar docking of the probe card assembly 406. As also shown, planarizing mechanism 410 of probe card assembly 406 is intentionally set with a matching non-planarity. While the probe card assembly 406 is docked to reference structure 402, the non-planarities intentionally set by adjustment mechanism 404 and the planarizing mechanism 410 cancel so that probes 414 are planar. Only probe card assemblies 406 set with a matching nonplanarity, however, will dock with reference structure 402 to provide planarized probes 414. The non-planar setting of adjustment mechanism 404 thus acts as a key, allowing only probe card assemblies 406 set with a matching nonplanarity to be used with the docking and adjustment assembly 400.

FIG. 27 illustrates an exemplary probe card assembly 406' according to some embodiments of the invention that can be used in place of probe card assembly 406 in any of the embodiments described herein. As shown, probe card assembly 406', like probe card assembly 406, includes a mounting fixture 408. Probe card assembly 406', however, includes a plurality of probe substrates 412', 412" comprising probes 414', 414", which together form a larger array of probes 2702. Each of probe substrates 412', 412" and probes 414', 414" may be generally similar to probe substrate 412 and probes 414. Probe card assembly 406' also includes a plurality of planarizing mechanisms 410', 410", each of which may be generally similar to planarizing mechanism 410. Although two probe substrates 414', 414" are shown, more may be used. Similarly, more than two planarizing mechanisms 410', 410" may be used. An example of a probe card assembly comprising a plurality of probe substrates is disclosed in the aforementioned U.S. patent application Ser. No. 11/165,833.

Figure 28:
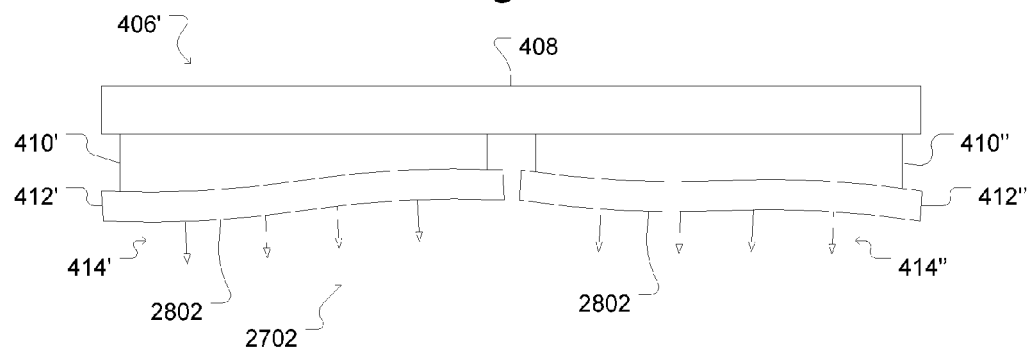
FIGS. 28-30 illustrate exemplary sources and correction of mis-orientation of probes.
Figure 29:
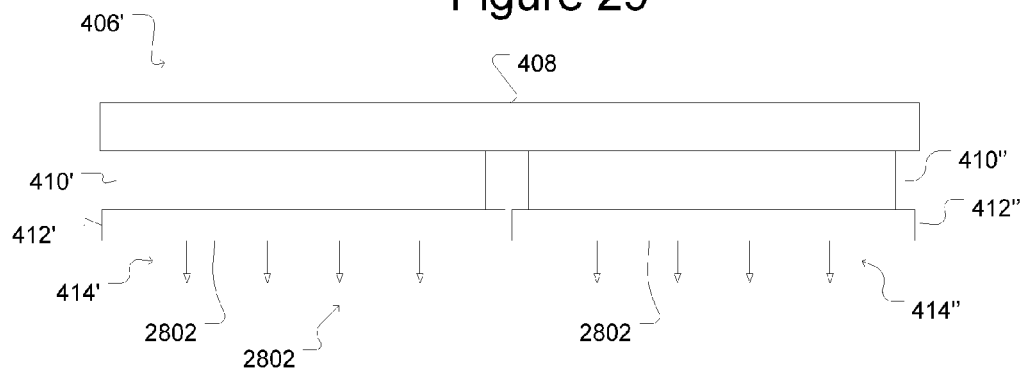
Figure 30:
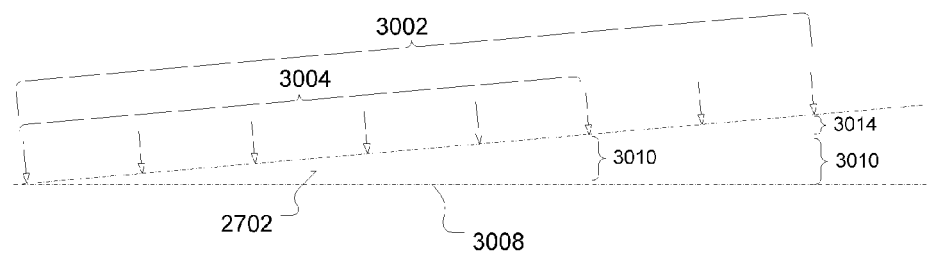

Thus, by using multiple probe substrates (e.g., 412', 412") as shown in FIG. 27, a relatively large array of probes can be created from smaller sets of probes (e.g., 414', 414"). The larger the array of probes, however, the more difficult it can be to orient probes such that their tips lie in a desired orientation (e.g., a plane or an approximate plane). FIGS. 28-30 illustrate exemplary sources of mis-orientation of the probes of probe array 2702 and the use of various embodiments disclosed herein to correct such mis-orientation.

FIG. 28 shows the probe card assembly 406' of FIG. 27 after manufacture of the probe card assembly 406'. As shown, tips of probes 414' and 414", which form probe array 2702, do not lie in a desired orientation (e.g., a plane or an approximate plane). Several factors can contribute to the irregular, undesired orientation of the probes of probe array 2702.

One such factor is irregularities in the surfaces 2802 of probe substrates 412', 412" to which probes 414', 414" are attached. For example, rather than being perfectly planar, surfaces 2802 may include imperfections such as curves or other irregularities. In fact, the larger the area of surface 2802, the more likely surface 2802 will contain more than negligible imperfections and irregularities. For example, assuming a desired orientation of the probes of array 2702 is an orientation in which the probe tips lie in a plane or an approximate plane, irregularities in surfaces 2802 of probe substrates 414', 414" may introduce non-planarities into the orientation of the probe array 2702.

Another source of irregularities in the orientation of the probes of probe array 2702 is the probes themselves. For example, ones of the probes of array 2702 may be slightly smaller or larger than others of the probes. As one such example, ones of the probes of array 2702 may extend from surfaces 2802 by a length that is more or less than others of the probes. Again assuming for the sake of example that the desired orientation of the tips of probes in array 2702 is a plane, slight irregularities in the size of the probes may introduce non-planarities into the orientation of the probe array 2702.

Yet another source of irregularities in the orientation of the probes of array 2702 can arise from the mechanism that attaches probe substrates 412', 412" to mounting fixture 408. The attachment mechanism (which is planarizing mechanisms 410', 410" in FIG. 28) may cause a slight tilt of probe substrates 412', 412" with respect to mounting fixture 408. The attachment mechanism can also exert slightly uneven forces on probe substrates 412', 412", which may introduce irregularities into surfaces 2802 of probe substrates 412', 412".

As discussed above, planarizing mechanisms 410', 410" are configured to correct irregularities in the orientation of the probes of probe array 2702 and move the tips of the probes into a desired orientation (e.g., a plane or an approximate plane or corresponding to a surface defined by the DUT terminals to be contacted by the probes) with respect to mounting fixture 408. Utilizing planarizing mechanisms 410', 410" as discussed above, each probe substrate 412', 412" can be manipulated to place probes 414' and probes 414" into desired orientations, which in turn creates a desired orientation of the probe array 2702 formed by probes 414', 414". Assuming that a desired orientation of the tips of the probes of array 2702 is planar, planarizing mechanisms 410', 410" can put the tips of the probes of array 2702 into a planar orientation with respect to mounting fixture 408, as shown in FIG. 29. In fact, where planarizing mechanisms 410', 410" comprise differential screw assemblies, tips of probes in an array (e.g., like 2702) measuring about 191 millimeters by 191 millimeters have been planarized with respect to a reference structure (e.g., mounting fixture 408) on a probe card assembly (e.g., 406') to within about 11 microns. (That is, as a first of the probes contacts a plane, all of the other probes are no further than 11 microns from the plane.) The foregoing numerical example is exemplary only and not limiting. For example, in some cases, more or less planarity of the probes will be achieved using differential screw assemblies as actuators. In addition, one may be able to achieve more or less planarity of the probes using other types of actuators, such as pneumatically operated actuators. The size of the probe array can also affect the degree of planarity achieved. Also, different test scenarios may require more or less planarity of the probe array.

No matter how perfectly or near perfectly the probes of probe array 2702 are oriented with respect to mounting fixture 408, however, additional mis-orientations of the probe array 2702 with respect to DUT terminals (not shown) are can be introduced by the testing apparatus (e.g., test system 401 of FIG. 1 or 101 of FIG. 6) while the probe card assembly 406' is mounted in the testing apparatus. For example, the structure in the testing apparatus to which the probe card assembly 406' is attached may have structural imperfections that cause a tilt of the probe card assembly 406' with respect to the testing apparatus. As another example, the mechanism (e.g., stage 430, 130) that holds the DUT to be contacted by the probe card assembly 406' may be askew, which causes a mis-orientation of the probes of the probe card assembly 406' with respect to the DUT terminals (not shown).

Whatever the cause of the mis-orientation of the probes of array 2702 with respect to the DUT terminals (not shown), the greater the size of the probe array 2702, the greater the detrimental effect of any skew or other mis-orientation of the probe array 2702 with respect to the DUT terminals (not shown). FIG. 30—which shows probe array 2702 as planarized in FIG. 29 (for ease of illustration reference structure 408, planarizing mechanisms 410', 410", and probe substrates 412', 412" are not shown) but askew with respect to a surface 3008 corresponding to DUT terminals (not shown)—illustrates how the effect of a planarizing error introduced by the testing apparatus increases with the size of the probe array 2702. As shown, the amount of a planarizing error for a smaller array identified by reference numeral 3004 in FIG. 30 is distance 3010. For a larger array identified by reference numeral 3002 in FIG. 30, however, the same skew of probe array 2702 with respect to the surface 3008 defined by DUT terminals (not shown) gives rise to a greater planarizing error identified in FIG. 30 as distance 3010 plus an additional distance 3014.

Thus, in the example shown in FIG. 30, the probes of probe array 2702, which were precisely adjusted to lie in a plane (or an approximate plane) as shown in FIG. 29, are askew with respect to a surface 3008 corresponding to the DUT terminals (not shown) while mounted in a testing apparatus, which gives rise to a planarizing error whose magnitude increases with the size of the probe array 2702. Referring to the example discussed above with respect to FIG. 29, a probe array 2702 planarized with respect to mounting structure 408 to within about 18 microns can be out of orientation with a surface 3008 defined by DUT terminals (not shown) by two, three, four, five, or more times that amount while the probe card assembly 406' is mounted in the testing apparatus (not shown). Adjustment mechanism 404 (see FIGS. 1, 4, and 5, among other figures), is able to reduce most if not all of such planarizing errors caused by skew introduced by the testing apparatus and bring the orientation of probe array 2702 back to the precision shown in FIG. 29 (e.g., about 18 microns in some cases) to a desired tolerance.

Thus, although the invention is not so limited, the ability to adjust the orientation of probe array 2702 with respect to a reference structure (e.g., mounting fixture 408 in FIG. 29) on the probe card assembly 406' to correct for mis-orientations of probe array 2702 caused by irregularities in probe substrates 412' and 412", probes 414' and 414", and/or mechanisms that attach probe substrates 412' and 412" to mounting fixture 408 as shown in FIG. 29, and then further adjust an orientation of the probe card assembly 406' with respect to the test apparatus (not shown) after the probe card assembly 406' is mounted in the test apparatus (not shown) to correct mis-orientations caused by irregularities in the test apparatus, allows the probe array 2702 to be precisely oriented with respect to the DUT terminals (not shown) contacted by the probe array 2702 and reduces skew errors, which as shown in FIG. 30, are particularly pronounced for large probe arrays.

Reducing the mis-orientation of the probes with respect to the DUT terminals can provide additional advantages. For example, reducing mis-orientation of probes with respect to DUT terminals can increase the uniformity and repeatability of scrub marks made by the probes on the DUT terminals and can decrease the size of the scrub marks. As is known in the field, the ability to repeatedly produce smaller, more uniform scrub marks on DUT terminals (e.g., bond pads of semiconductor dies) provides many advantages, such as, without limitation, facilitating the bonding of wires to the DUT terminals.

Each of the embodiments described herein can be configured such that a user can more quickly adjust an orientation of probe card assembly 406, 406' using adjustment mechanism 404 than the user can adjust an orientation of probe substrate(s) 412, 412', 412" using planarizing mechanism(s) 410, 410', 410". Thus, although planarizing mechanism(s) 410, 410', 410"—rather than adjustment mechanism 404—could be used to reduce mis-orientation of the probes 414, 414', 414" with respect to DUT terminals caused by irregularities in the mounting of the probe card assembly to the testing apparatus (as discussed above with respect to FIG. 30), a user will typically be able to reduce such mis-orientation more quickly using adjustment mechanism 404 to adjust the orientation of probe card assembly 406, 406'.

Although discussed for ease of description and illustration with respect to the probe card assembly 406' having two probe substrates 412', 412", the foregoing advantages are equally applicable to probe card assembly 406, which is illustrated as having one probe substrate 412 but, as discussed above, may have more than one substrate 412, or to a probe card assembly that has three or more probe substrates.

Figure 24:
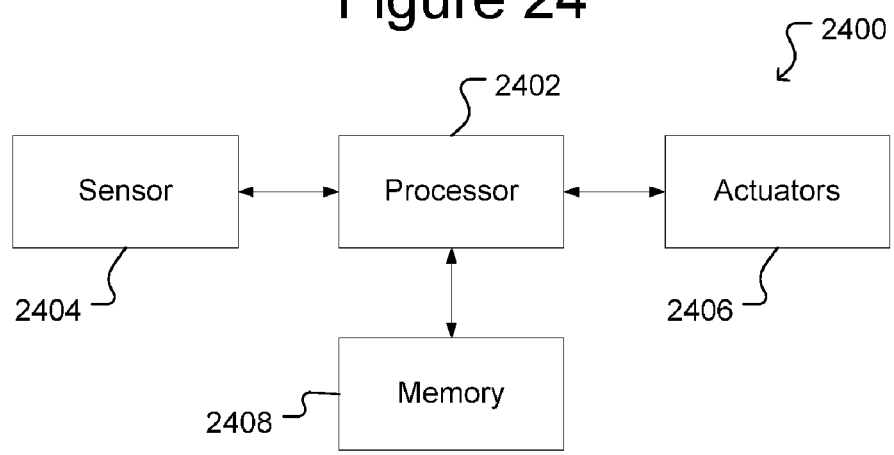
FIG. 24 illustrates an exemplary system for executing the process of FIG. 23.

Although specific embodiments and applications of the invention have been described in this specification, there is no intention that the invention be limited these exemplary embodiments and applications or to the manner in which the exemplary embodiments and applications operate or are described herein. For example, the locations of actuators (e.g., 702, 1312, 1406, 1704, 2050) and spring biasing mechanisms (e.g., 1402, 1902) may be changed from what is shown in the exemplary embodiments illustrated in the figures. As one example, actuators (e.g., 702, 1312, 1406, 1704, 2050) may be attached to any one or more of the following: any part of a probe card assembly (e.g., 406), an insert ring (e.g., 110), a bridge structure (e.g., 1802, 2000), a head plate (e.g., 112), other elements of a prober (e.g., 122) or housing (e.g., 422), or any part of a test head (e.g., 106). Biasing spring mechanisms (e.g., 1402, 1902) may also be attached to any part of a probe card assembly (e.g., 406), an insert ring (e.g., 110), a bridge structure (e.g., 1802, 2000), a head plate (e.g., 112), other elements of a prober (e.g., 122) or housing (e.g., 422), or any part of a test head (e.g., 106). Electronics and other elements for sensing a position of the probe card assembly (e.g., 406), probes (e.g., 414), DUT (e.g. 420) and for changing an orientation of probes (e.g., 414) and/or probe card assembly (e.g., 406) may be disposed in whole or in part on one or more of the any part of a probe card assembly (e.g., 406), an insert ring (e.g., 110), a bridge structure (e.g., 1802, 2000), a head plate (e.g., 112), other elements of a prober (e.g., 122) or housing (e.g., 422), or any part of a test head (e.g., 106). Another exemplary modification the orientation of DUT 420 can be adjusted by tilting or otherwise moving chuck 424. The chuck 424 thus can be used to planarize terminals 418 of DUT 420 to probes 414. Such use of chuck 424 can be in place or in addition to planarizing probes 414. Yet another exemplary modification is as follows: although memory 2156 and controller 2154 are shown in FIG. 24 and described above as communicating wirelessly, memory 2156 and controller 2154 can alternatively communicate through a direct wired link (not shown).

What is claimed is:

1. A probe card assembly comprising:
   a plurality of probes disposed on a rigid probe substrate and arranged to contact terminals of an electronic device to be tested while the probe card assembly is attached to a test station;
   a reference structure;
   a first adjustment mechanism coupled to the probe substrate and to the reference structure, the first adjustment mechanism comprising first adjustment elements that vary an orientation of the probes with respect to the reference structure;
   a mounting structure positioned to contact a second structure of the test station; and
   a second adjustment mechanism coupled to the mounting structure and to the reference structure, the second adjustment mechanism comprising second adjustment elements that vary, while the probe card assembly is attached to the test station, an orientation of the reference structure with respect to the second structure of the test station.

2. The probe card assembly of claim 1, wherein the second adjustment mechanism comprises a plurality of actuators disposed on the reference structure and oriented to apply forces to the mounting structure.

3. The probe card assembly of claim 2, wherein the second adjustment mechanism further comprises means for biasing the reference structure in opposition to the forces applied by the actuators.

4. The probe card assembly of claim 2, wherein the second adjustment mechanism further comprises means for receiving biasing forces from the means for biasing the reference structure in opposition to the forces applied by the actuators.

5. The probe card assembly of claim 1, wherein the second adjustment mechanism comprises a plurality of actuators disposed on the mounting structure and oriented to apply forces to the reference structure.

6. The probe card assembly of claim 5, wherein the second adjustment mechanism further comprises means for biasing the reference structure in opposition to the forces applied by the actuators.

7. The probe card assembly of claim 5, wherein the second adjustment mechanism further comprises means for receiving biasing forces from the means for biasing the reference structure in opposition to the forces applied by the actuators.

8. The probe card assembly of claim 1 further comprising an electrical interface to a tester, wherein ones of the probes are electrically connected to the interface.

9. A probe card assembly comprising:
   a plurality of probes disposed on a rigid probe substrate and arranged to contact terminals of an electronic device to be tested while the probe card assembly is attached to a test station;
   a reference structure;
   a first adjustment mechanism coupled to the probe substrate and to the reference structure, the first adjustment mechanism comprising first adjustment elements that vary an orientation of the probes with respect to the reference structure of the probe card assembly;
   a mounting structure positioned to contact a second structure of the test station; and
   a second adjustment mechanism coupled to the mounting structure and to the reference structure, the second adjustment mechanism comprising second adjustment elements that vary, while the probe card assembly is attached to the test station, an orientation of the reference structure with respect to the second structure of the test station; and
   a digital memory device configured to store digital data representing a predetermined orientation of the probe card assembly with respect to the test station.

10. The probe card assembly of claim 9, wherein the predetermined orientation comprises an orientation of the probe card assembly with respect to the test station previously determined to planarize the probes with terminals of the electronic device as disposed in a test position in the test station.

11. A probe card assembly comprising:
    a plurality of probes disposed on a rigid probe substrate and arranged to contact terminals of an electronic device to be tested while the probe card assembly is attached to a test station;
    a reference structure;
    a first adjustment mechanism coupled to the probe substrate and to the reference structure, the first adjustment mechanism comprising first adjustment elements that vary an orientation of the probes with respect to the reference structure of the probe card assembly;
    a mounting structure positioned to contact a second structure of the test station; and
    a second adjustment mechanism coupled to the mounting structure and to the reference structure, the second adjustment mechanism comprising second adjustment elements that vary, while the probe card assembly is attached to the test station, an orientation of the probe card assembly with respect to the second structure of the test station; and
    a wireless transmitting device configured to transmit digital data to a controller configured to control the second adjustment mechanism.

12. The probe card assembly of claim 1, wherein the electronic device comprises one or more dies of an unsingulated semiconductor wafer.

13. The probe card assembly of claim 1, wherein the electronic device comprises one or more singulated semiconductor dies.

14. A probe card assembly comprising:
    a plurality of probes disposed on a rigid probe substrate and arranged to contact terminals of an electronic device to be tested while the probe card assembly is attached to a test station;
    first adjusting means for adjusting an orientation of the probes with respect to a reference structure of the probe card assembly;
    mounting means for mounting the probe card assembly to the test station; and
    second adjusting means for adjusting an orientation of the reference structure with respect to a structure of the test station while the probe card assembly is attached to the test station.

15. The probe card assembly of claim 14, wherein the mounting means comprises means for attaching the probe card assembly to the test station.

16. The probe card assembly of claim 14, wherein the second adjusting means comprises means for adjusting the orientation of the probe card assembly relative to a reference structure of the test station.

17. The probe card assembly of claim 16, wherein the second adjusting means comprises means for connecting to the reference structure of the test station.

* * * * *

(12) INTER PARTES REEXAMINATION CERTIFICATE (496th)
United States Patent
Eldridge et al.

(10) Number: US 7,671,614 C1
(45) Certificate Issued: Dec. 18, 2012

(54) APPARATUS AND METHOD FOR ADJUSTING AN ORIENTATION OF PROBES

(75) Inventors: Benjamin N. Eldridge, Danville, CA (US); Eric D. Hobbs, Livermore, CA (US); Gaetan L. Mathieu, Livermore, CA (US); Makarand S. Shinde, Livermore, CA (US); Alexander H. Slocum, Bow, NH (US)

(73) Assignee: FormFactor, Inc., Livermore, CA (US)

Reexamination Request:
No. 95/000,629, Apr. 13, 2011

Reexamination Certificate for:
Patent No.: 7,671,614
Issued: Mar. 2, 2010
Appl. No.: 11/164,737
Filed: Dec. 2, 2005

(51) Int. Cl.
*G01R 31/00* (2006.01)
*G01R 31/20* (2006.01)

(52) U.S. Cl. .............................. 324/750.19; 324/754.03
(58) Field of Classification Search .................. 324/758
See application file for complete search history.

(56) References Cited

To view the complete listing of prior art documents cited during the proceeding for Reexamination Control Number 95/000,629, please refer to the USPTO's public Patent Application Information Retrieval (PAIR) system under the Display References tab.

*Primary Examiner* — Robert Nasser

(57) ABSTRACT

Probes of a probe card assembly can be adjusted with respect to an element of the probe card assembly, which can be an element of the probe card assembly that facilitates mounting of the probe card assembly to a test apparatus. The probe card assembly can then be mounted in a test apparatus, and an orientation of the probe card assembly can be adjusted with respect to the test apparatus, such as a structural part of the test apparatus or a structural element attached to the test apparatus.

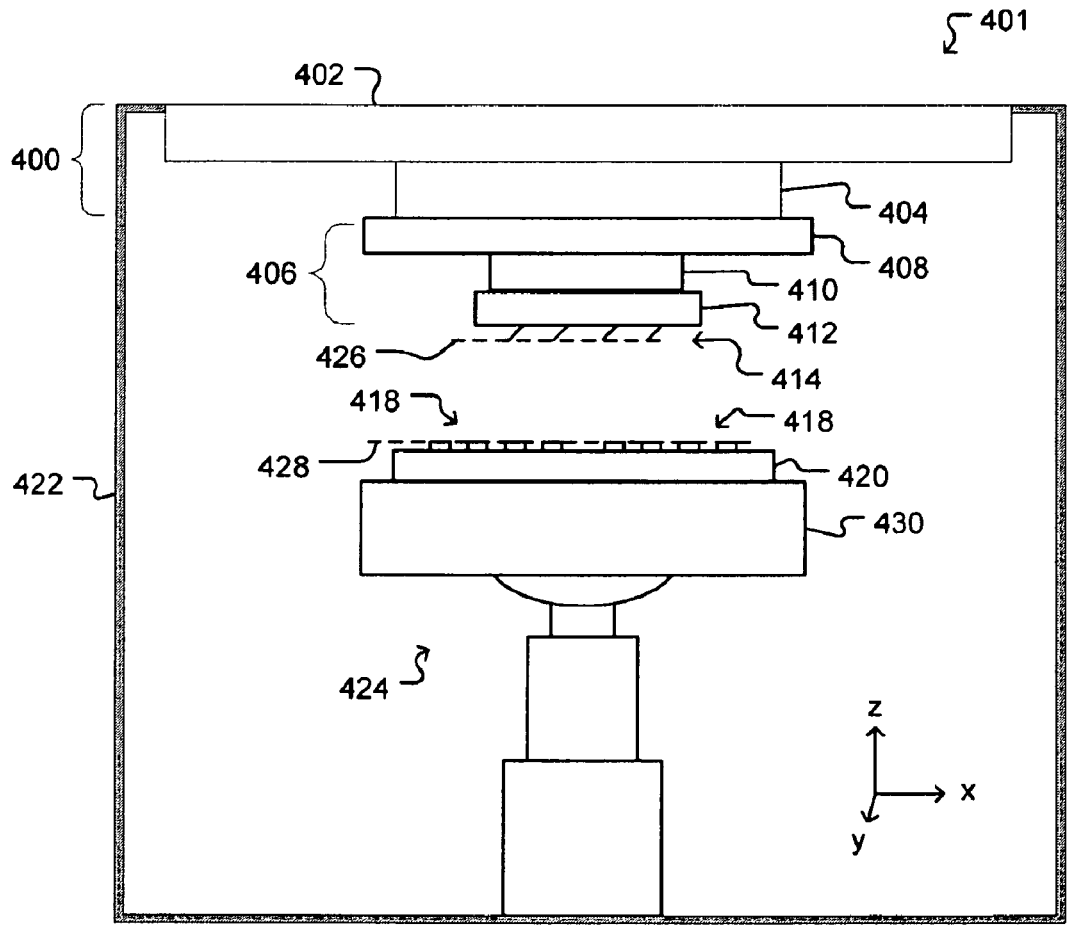

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-17 is confirmed.

New claims 18-33 are added and determined to be patentable.

*18. A probe card assembly comprising:*
*a plurality of probes disposed on a rigid probe substrate and arranged for contact tips of the probes to contact terminals of an electronic device to be tested while the probe card assembly is attached to a test station;*
*a reference structure coupled to the probe substrate;*
*a first adjustment mechanism coupled to the probe substrate and to the reference structure, the first adjustment mechanism comprising first adjustment elements that vary an orientation of the probes with respect to the reference structure by altering a shape of the probe substrate and thereby altering a shape of a surface defined by the contact tips of the probes;*
*a mounting structure positioned to contact a second structure of the test station; and*
*a second adjustment mechanism coupled to the mounting structure and to the reference structure, the second adjustment mechanism comprising second adjustment elements that vary, while the probe card assembly is attached to the test station, an orientation of the reference structure with respect to the second structure of the test station.*

*19. The probe card assembly of claim 18, wherein the second adjustment mechanism comprises a plurality of actuators disposed on the reference structure and oriented to apply forces to the mounting structure.*

*20. The probe card assembly of claim 18 further comprising an electrical interface to a tester, wherein ones of the probes are electrically connected to the interface.*

*21. The probe card assembly of claim 18, wherein the electronic device comprises one or more dies of an unsingulated semiconductor wafer.*

*22. The probe card assembly of claim 18, wherein the electronic device comprises one or more singulated semiconductor dies.*

*23. The probe card assembly of claim 18, wherein the mounting structure comprises the reference structure.*

*24. The probe card assembly of claim 18, wherein the first adjustment mechanism couples the probe substrate to the reference structure.*

*25. A probe card assembly comprising:*
*a plurality of probes disposed on a rigid probe substrate and arranged for contact tips of the probes to contact terminals of an electronic device to be tested while the probe card assembly is attached to a test station;*
*a reference structure coupled to the probe substrate;*
*first adjusting means for adjusting an orientation of the probes with respect to the reference structure by altering a shape of the probe substrate and thereby altering a shape of a surface defined by the contact tips of the probes;*
*mounting means for mounting the probe card assembly to the test station; and*
*second adjusting means for adjusting an orientation of the reference structure with respect to a structure of the test station while the probe card assembly is attached to the test station.*

*26. The probe card assembly of claim 25, wherein the mounting means comprises the reference structure.*

*27. The probe card assembly of claim 18, wherein the first adjustment elements directly contact different areas of the probe substrate.*

*28. The probe card assembly of claim 18, wherein the first adjustment elements directly abut different areas of the probe substrate without being attached to the probe substrate.*

*29. The probe card assembly of claim 18, wherein:*
*the probes extend from a first side of the probe substrate,*
*the first adjustment elements apply forces directly to different areas of a second side of the probe substrate, and*
*the second side is opposite the first side.*

*30. The probe card assembly of claim 18, wherein the second adjustment mechanism comprises a plurality of actuators disposed on the mounting structure and oriented to apply forces to the reference structure.*

*31. The probe card assembly of claim 25, wherein the first adjusting means directly contacts the probe substrate.*

*32. The probe card assembly of claim 25, wherein the first adjusting means directly abuts the probe substrate without being attached to the probe substrate.*

*33. The probe card assembly of claim 25, wherein:*
*the probes extend from a first side of the probe substrate,*
*the first adjusting means selectively applies forces directly to different areas of a second side of the probe substrate, and*
*the second side is opposite the first side.*

\* \* \* \* \*